United States Patent
Zhang et al.

(10) Patent No.: US 11,057,052 B2
(45) Date of Patent: Jul. 6, 2021

(54) DATA PROCESSING METHOD AND APPARATUS TO RESTORE MOTHER CODE SEQUENCES WITH DIFFERENT CODE LENGTHS BY USING AN INDICATION SEQUENCE AND A BASIC SEQUENCE

(71) Applicant: HUAWEI TECHNOLOGIES CO., LTD., Guangdong (CN)

(72) Inventors: Gongzheng Zhang, Hangzhou (CN); Rong Li, Hangzhou (CN); Jun Wang, Hangzhou (CN); Ying Chen, Hangzhou (CN); Huazi Zhang, Hangzhou (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 17 days.

(21) Appl. No.: 16/564,774

(22) Filed: Sep. 9, 2019

(65) Prior Publication Data

US 2020/0007162 A1  Jan. 2, 2020

Related U.S. Application Data

(63) Continuation of application No. PCT/CN2018/078502, filed on Mar. 9, 2018.

(30) Foreign Application Priority Data

Mar. 10, 2017 (CN) .......................... 201710142969.6

(51) Int. Cl.
*H03M 13/00* (2006.01)
*H03M 13/13* (2006.01)

(52) U.S. Cl.
CPC .................................. *H03M 13/13* (2013.01)

(58) Field of Classification Search
CPC ... H03M 13/13; H03M 13/251; H04L 1/0057; G06F 11/076
See application file for complete search history.

(56) References Cited

U.S. PATENT DOCUMENTS

| | | | | |
|---|---|---|---|---|
| 5,799,033 A | * | 8/1998 | Baggen | H03M 13/275 375/250 |
| 6,963,601 B1 | * | 11/2005 | Kim | H04B 1/707 375/146 |

(Continued)

FOREIGN PATENT DOCUMENTS

| CN | 101233693 A | 7/2008 |
|---|---|---|
| CN | 103209057 A | 7/2013 |

(Continued)

OTHER PUBLICATIONS

Qualcomm Inc.:"Polar code information bit allocation and nested extension construction", 3GPP draft R1-1701187, RAN WG1, Spokane, USA, XP051208711, 13 pages.

(Continued)

*Primary Examiner* — Esaw T Abraham
(74) *Attorney, Agent, or Firm* — Womble Bond Dickinson (US) LLP

(57) ABSTRACT

A data processing method is disclosed, and the method includes: receiving, by an encoding end, a to-be-encoded data block; obtaining, by the encoding end, a first mother code element for each first indication element in a first indication sequence based on an association relationship in which $S=Q+B*N0$ when $B>0$, and $S=Q$ when $B=0$; and placing the first mother code element at a location of the first indication element in the first indication sequence to obtain a first mother code sequence.

20 Claims, 11 Drawing Sheets

(56) References Cited

U.S. PATENT DOCUMENTS

| | | | | |
|---|---|---|---|---|
| 8,347,186 | B1* | 1/2013 | Arikan | H03M 13/1148 |
| | | | | 714/774 |
| 8,543,884 | B2* | 9/2013 | Mansour | H03M 13/6525 |
| | | | | 714/755 |
| 9,722,651 | B2* | 8/2017 | Goela | H04L 1/0041 |
| 10,142,144 | B2* | 11/2018 | Carvalho | H04B 1/0483 |
| 2003/0215023 | A1* | 11/2003 | Chang | H04L 1/0054 |
| | | | | 375/265 |
| 2007/0223622 | A1* | 9/2007 | Bang | H04L 1/0625 |
| | | | | 375/299 |
| 2013/0163988 | A1* | 6/2013 | Krongold | H04J 14/06 |
| | | | | 398/65 |
| 2016/0013810 | A1* | 1/2016 | Gross | H03M 13/13 |
| | | | | 714/776 |
| 2016/0013887 | A1 | 1/2016 | Shen et al. | |
| 2016/0218743 | A1 | 7/2016 | Li et al. | |
| 2019/0268025 | A1 | 8/2019 | Shen et al. | |

FOREIGN PATENT DOCUMENTS

| | | |
|---|---|---|
| CN | 103825669 A | 5/2014 |
| CN | 104079370 A | 10/2014 |
| CN | 104219019 A | 12/2014 |
| EP | 3054599 A1 | 8/2016 |
| EP | 2637335 B1 | 1/2018 |

OTHER PUBLICATIONS

Huawei:"Construction schemes for polar codes", 3GPP Draft, R1-1701702, RAN WG1, Athens, Greece, XP051208868, 7 pages.

Qualcomm Inc.:"Design of Polar codes for control channel", 3GPP Draft, R1-1700832, RAN WG1, Spokane, USA, XP051208351, 5 pages.

Mehrdad Valipour."Multiple description coding with polar codes", dated Jul. 23, 2014, total 4 pages.

* cited by examiner

| 0 | 1 | 2 | 4 | 8 | 3 | 5 | 6 | 9 | 10 | 12 | 7 | 11 | 13 | 14 | 15 |
|---|---|---|---|---|---|---|---|---|---|---|---|---|---|---|---|
| 00 | 01 | 10 | 00 | 01 | 11 | 00 | 00 | 01 | 01 | 10 | 00 | 01 | 10 | 10 | 10 |
|  |  |  | 0+4 | 0+8 | 3 | 1+4 | 2+4 | 1+8 | 2+8 | 0+12 | 3+4 | 3+8 | 1+12 | 2+12 | 3+12 |

FIG. 5

| 0 | 1 | 2 | 4 | 8 | 3 | 5 | 6 | 9 | 10 | 12 | 7 | 11 | 13 | 14 | 15 |
|---|---|---|---|---|---|---|---|---|----|----|---|----|----|----|----|
| 0000 | 0001 | 0010 | 0100 | 1000 | 0011 | 0101 | 0110 | 1001 | 1010 | 1100 | 0111 | 1011 | 1101 | 1110 | 1111 |

FIG. 6

| 0 | 1 | 2 | 4 | 8 | 3 | 5 | 6 | 9 | 10 | 12 | 7 | 11 | 13 | 14 | 15 |
|---|---|---|---|---|---|---|---|---|---|---|---|---|---|---|---|
| 000 | 001 | 010 | 100 | 000 | 011 | 101 | 110 | 000 | 000 | 000 | 111 | 000 | 000 | 000 | 000 |
| | | | | 0+8 | | | | 1+8 | 2+8 | 4+8 | | 3+8 | 5+8 | 6+8 | 7+8 |

| 0 | 1 | 2 | 4 | 8 | 3 | 5 | 6 | 9 | 10 | 12 | 7 | 11 | 13 | 14 | 15 |
|---|---|---|---|---|---|---|---|---|----|----|---|----|----|----|----|
| 0 | 0 | 0 | 0 | 1 | 0 | 0 | 0 | 1 | 1  | 1  | 0 | 1  | 1  | 1  | 1  |
|   |   |   |   | 0+8 |   |   |   | 1+8 | 2+8 | 4+8 |   | 3+8 | 5+8 | 6+8 | 7+8 |

FIG. 9

DATA PROCESSING METHOD AND APPARATUS TO RESTORE MOTHER CODE SEQUENCES WITH DIFFERENT CODE LENGTHS BY USING AN INDICATION SEQUENCE AND A BASIC SEQUENCE

CROSS-REFERENCE TO RELATED APPLICATIONS

This application is a continuation of International Application No. PCT/CN2018/078502, filed on Mar. 9, 2018, which claims priority to Chinese Patent Application No. 201710142969.6, filed on Mar. 10, 2017. The disclosures of the aforementioned applications are hereby incorporated by reference in their entireties.

TECHNICAL FIELD

Embodiments of the present invention relate to the field of electronic and communications technologies, and more specifically, to a data processing method and apparatus.

BACKGROUND

An encoding technology is usually used in a communications system to improve data transmission reliability to ensure communication quality. A polar code (Polar codes) algorithm is a first encoding and decoding algorithm that can obtain a Shannon capacity as proved in theory and that has low encoding and decoding complexity (both encoding complexity and decoding complexity are O(N log N)).

An information bit set A needs to be determined in a polar code encoding process. Mother code sequences used to construct the set A are ranked based on reliability of polar channels indicated by the mother code sequences. Different code lengths and bit rates correspond to mother code sequences of different lengths. In the prior art, an encoder and a decoder prestore a plurality of mother code sequences. During polar code encoding, a corresponding mother code sequence is selected based on a required bit rate and code length.

In the prior art, to support all combinations of code lengths and bit rates required by a system, a large quantity of mother code sequences need to be stored. Consequently, storage overheads of the system are relatively large.

SUMMARY

Embodiments of the present invention provide a data processing method and apparatus, to restore mother code sequences with different code lengths by using an indication sequence and a basic sequence. Because the indication sequence and the basic sequence occupy small storage space, storage overheads are reduced.

According to a first aspect, an embodiment of the present invention provides a data processing method, and the method includes the following operations.

S201. An encoding end receives a to-be-encoded data block.

S202. The encoding end obtains a first mother code element for each first indication element in a first indication sequence based on an association relationship in which $S=Q+B*N0$ when $B>0$, and $S=Q$ when $B=0$, where B is a value indicated by the first indication element, N0 is a quantity of first basic elements in a first basic sequence, Q is a value indicated by a first basic element corresponding to the first indication element, and S is a value indicated by the first mother code element; and places the first mother code element at a location of the first indication element in the first indication sequence to obtain a first mother code sequence, where the N0 first basic elements in the first basic sequence are used to indicate N0 consecutive polar channel sequence numbers, N1 first mother code elements in the first mother code sequence are used to indicate N1 consecutive polar channel sequence numbers, the N1 polar channel sequence numbers include the N0 polar channel sequence numbers, and the polar channel sequence number is used to indicate a polar channel; the first mother code elements are ranked in the first mother code sequence in ascending order or descending order of reliability of polar channels indicated by the first mother code elements, where N1 is a positive integer multiple of N0, N0 equals to $2^x$, N1 equals to $2^y$, and X and Y both are positive integers; and the first indication elements at different locations in the first indication sequence have at least two different values, and correspondingly, B also has at least two different values, where B is an integer, and the at least two different values are consecutive values starting from 0.

S203. The encoding end encodes the data block in a polar encoding manner by using the first mother code sequence.

S204. The encoding end outputs a result obtained after the data block is encoded.

In this embodiment of the data processing method, the first mother code sequence is restored based on a multiple relationship, displayed in the first indication sequence, between each first mother code element in the first mother code sequence and the first basic element in the first basic sequence. In this way, only the first indication sequence and the first basic sequence need to be stored, and the first mother code sequence does not need to be stored. It is easy to understand that a value indicating the multiple relationship is inevitably less than a value in the first mother code sequence, and when the value is small, a quantity of bits used to indicate the value is correspondingly decreased. In this way, a quantity of bits occupied to store the first indication sequence and the first basic sequence is less than a quantity of bits occupied to store the first mother code sequence, thereby reducing storage overheads.

In one embodiment, that the N0 first basic elements are used to indicate N0 consecutive polar channel sequence numbers, and N1 first mother code elements are used to indicate N1 consecutive polar channel sequence numbers means the following:

the N0 first basic elements are used to indicate polar channel sequence numbers from W to W+N0−1, and the N1 first mother code elements are used to indicate polar channel sequence numbers from W to W+N1−1, where W is an integer greater than or equal to 0; or in other words, the polar channel sequence numbers indicated by the N0 first basic elements are integers in [W, W+N0−1], and the polar channel sequence numbers indicated by the N1 first mother code elements are integers in [W, W+N1−1], for example, the N0 first basic elements are used to indicate polar channel sequence numbers from 0 to N0−1, and the N1 first mother code elements are used to indicate polar channel sequence numbers from 0 to N1−1.

Although the polar channel sequence numbers indicated by the N1 first mother code elements in the first mother code sequence are consecutive, the polar channel sequence numbers do not necessarily start from 0, and may start from any integer value. However, storage space is reduced when the polar channel sequence numbers start from 0. Although the polar channel sequence numbers indicated by the N0 first basic elements in the first basic sequence are consecutive, the polar channel sequence numbers do not necessarily start from 0, and may start from any integer value. However, storage space is reduced when the polar channel sequence numbers start from 0. Although polar channel sequence numbers in the offset sequence are consecutive, the polar channel sequence numbers do not necessarily start from 0, and may start from any integer value. However, storage space is reduced when the polar channel sequence numbers start from 0.

In one embodiment, N1 first indication elements in the first indication sequence are in a one-to-one correspondence with the N1 first mother code elements in the first mother code sequence.

In one embodiment, when the N1 first mother code elements are ranked in the first mother code sequence in ascending order of reliability of the polar channels indicated by the polar channel sequence numbers indicated by the N1 first mother code elements, correspondingly, N1 first indication elements in the first indication sequence are ranked in ascending order or descending order of reliability of polar channels indicated by polar channel sequence numbers indirectly indicated by the N1 first indication elements, and the N0 first basic elements are ranked in the first basic sequence in ascending order or descending order of reliability of polar channels indicated by the polar channel sequence numbers indicated by the N0 basic elements.

In one embodiment, when the N1 first mother code elements are ranked in the first mother code sequence in descending order of reliability of the polar channels indicated by the polar channel sequence numbers indicated by the N1 first mother code elements, correspondingly, N1 first indication elements in the first indication sequence are ranked in descending order or ascending order of reliability of polar channels indicated by polar channel sequence numbers indirectly indicated by the N1 first indication elements, and the N0 first basic elements are ranked in the first basic sequence in ascending order or descending order of reliability of polar channels indicated by the polar channel sequence numbers indicated by the N0 first basic elements.

In one embodiment, before operation S202, the method further includes:

extracting, by the encoding end from a second indication sequence, each second indication element indicating a value less than a maximum value of B and each second indication element indicating a value equal to the maximum value of B; and ranking the second indication elements in an order in which the second indication elements are ranked in the second indication sequence, to form the first indication sequence, where the second indication element indicating the value less than the maximum value of B and the second indication element indicating the value equal to the maximum value of B both are used as the first indication elements in the first indication sequence, and in addition to the second indication element indicating the value less than the maximum value of B and the second indication element indicating the value equal to the maximum value of B, the second indication sequence includes a second indication element indicating a value greater than the maximum value of B.

A length of the second indication sequence is greater than that of the first indication sequence. The longer second indication sequence may be generated based on a longer mother code sequence, and then the shorter first indication sequence is generated based on the longer second indication sequence.

In one embodiment, before operation S202, the method further includes:

extracting, by the encoding end from a second basic sequence, each second basic element indicating a value less than F and each second basic element indicating a value equal to F; and ranking the second basic elements in an order in which the second basic elements are ranked in the second basic sequence, to form the first basic sequence, where the second basic element indicating the value less than F and the second basic element indicating the value equal to F both are used as the first basic elements in the first basic sequence, and in addition to the second basic element indicating the value less than F and the second basic element indicating the value equal to F, the second basic sequence includes a second basic element indicating a value greater than F, where F is a positive integer.

The second basic sequence is a sequence whose length is greater than that of the first basic sequence, and the shorter first basic sequence may be generated based on the longer second basic sequence.

With reference to the first aspect or each of the foregoing possible implementations of the first aspect, in a seventh possible implementation, before operation S202, the method further includes:

obtaining, by the encoding end, the first basic element for each third indication element in a third indication sequence based on an association relationship in which S1=Q1+B1*N3 when B1>0, and S1=Q1 when B1=0, where B1 is a value indicated by the third indication element, N3 is a quantity of third basic elements in a third basic sequence, Q1 is a value indicated by a third basic element corresponding to the third indication element, S1 is a value indicated by the first basic element; and placing the first basic element at a location of the third indication element in the third indication sequence to obtain the first basic sequence, where the N3 third basic elements are used to indicate consecutive N3 polar channel sequence numbers, the N0 first basic elements are used to indicate N0 consecutive polar channel sequence numbers, the N0 polar channel sequence numbers include the N3 polar channel sequence numbers, and the polar channel sequence number is used to indicate a polar channel; the first basic elements are ranked in the first basic sequence in ascending order or descending order of reliability of polar channels indicated by the first basic elements; a quantity of third indication elements in the third indication sequence is N0, and correspondingly, the quantity of first basic elements in the first basic sequence is also N0, where N0 is a positive integer multiple of N3, N3 is $2^P$, and P is a positive integer; and the third indication elements at different locations in the third indication sequence have at least two different values, and correspondingly, B1 also has at least two different values, where B1 is an integer, and the at least two different values are consecutive values starting from 0.

In one embodiment, before operation S202, the method further includes:

obtaining, by the encoding end, the first basic element for each third indication element in a third indication sequence based on an association relationship in which S1=Q1+B1*N3, where B1 is a value indicated by the third indication element, N3 is a quantity of third basic elements in the third indication sequence, Q1 is a value indicated by a third basic element corresponding to the third indication element, S1 is a value indicated by the first basic element; and placing the first basic element at a location of the third indication element in the third indication sequence to obtain the first basic sequence, where a total quantity of the third basic elements and the third indication elements in the third indication sequence is N0, the third basic element in the third indication sequence is correspondingly used as the first basic element, and correspondingly, the quantity of first basic elements in the first basic sequence is also N0; the N3 third basic elements are used to indicate consecutive N3 polar channel sequence numbers, the N0 first basic elements in the first basic sequence are used to indicate N0 consecutive polar channel sequence numbers, the N0 polar channel sequence numbers include the N3 polar channel sequence numbers, and the polar channel sequence number is used to indicate a polar channel; the first basic elements are ranked in the first basic sequence in ascending order or descending order of reliability of polar channels indicated by the first basic elements, where N0 is a positive integer multiple of N3, N3 is $2^P$, and P is a positive integer; and the third indication elements at different locations in the third indication sequence have one value or a plurality of different values, and correspondingly, B1 also has one value or a plurality of different values, where B1 is an integer, the plurality of different values of B1 are consecutive values starting from 1, and B1 is 1 when B1 has one value.

In one embodiment, N1 is an even multiple of N0.

According to a second aspect, an embodiment of the present invention further provides a data processing method, and the method includes the following operations.

S201. An encoding end receives a to-be-encoded data block.

S302. The encoding end obtains a first mother code element for each first indication element in a first indication sequence based on an association relationship in which S=Q+B*N0, where B is a value indicated by the first indication element, N0 is a quantity of first basic elements in the first indication sequence, Q is a value indicated by a first basic element corresponding to the first indication element, and S is a value indicated by the first mother code element; and places the first mother code element at a location of the first indication element in the first indication sequence to obtain a first mother code sequence, where the N0 first basic elements are used to indicate N0 consecutive polar channel sequence numbers; a total quantity of the first indication elements and the first basic elements in the first indication sequence is N1, and correspondingly, a total quantity of the first mother code elements and the first basic elements in the first mother code sequence is also N1; the N1 elements including the first mother code elements and the first basic elements are used to indicate N1 consecutive polar channel sequence numbers, the N1 polar channel sequence numbers include the N0 polar channel sequence numbers, and the polar channel sequence number is used to indicate a polar channel; the first mother code elements and the first basic elements are ranked in the first mother code sequence in ascending order or descending order of reliability of polar channels indicated by the first mother code elements and the first basic elements, where N1 is a positive integer multiple of N0, N0 equals to $2^x$, N1 equals to $2^y$, and X and Y both are positive integers; and the first indication elements at different locations in the first indication sequence have one value or a plurality of different values, and correspondingly, B also has one value or a plurality of different values, where B is an integer, the plurality of different values of B are consecutive values starting from 1, and B is 1 when B has one value.

S203. The encoding end encodes the data block in a polar encoding manner by using the first mother code sequence.

S204. The encoding end outputs a result obtained after the data block is encoded.

In this embodiment of the data processing method, the first mother code sequence is restored based on a multiple relationship, displayed in the first indication sequence, between each first mother code element in the first mother code sequence and the first basic element in the first basic sequence. In this way, only the first indication sequence needs to be stored, and the first mother code sequence does not need to be stored. It is easy to understand that a value indicating the multiple relationship is inevitably less than a value in the first mother code sequence, and when the value is small, a quantity of bits used to indicate the value is correspondingly decreased. In this way, a quantity of bits occupied to store the first indication sequence is less than a quantity of bits occupied to store the first mother code sequence, thereby reducing storage overheads.

In one embodiment, that the N0 first basic elements are used to indicate N0 consecutive polar channel sequence numbers, and N1 first mother code elements are used to indicate N1 consecutive polar channel sequence numbers means the following:

the N0 first basic elements are used to indicate polar channel sequence numbers from W to W+N0−1, and the N1 first mother code elements are used to indicate polar channel sequence numbers from W to W+N1−1, where W is an integer greater than or equal to 0; or in other words, the polar channel sequence numbers indicated by the N0 first basic elements are integers in [W, W+N0−1], and the polar channel sequence numbers indicated by the N1 first mother code elements are integers in [W, W+N1−1], for example, the N0 first basic elements are used to indicate polar channel sequence numbers from 0 to N0−1, and the N1 first mother code elements are used to indicate polar channel sequence numbers from 0 to N1−1.

Although the polar channel sequence numbers indicated by the N1 first mother code elements in the first mother code sequence are consecutive, the polar channel sequence numbers do not necessarily start from 0, and may start from any integer value. However, storage space is reduced when the polar channel sequence numbers start from 0. Although the polar channel sequence numbers indicated by the N0 first basic elements in the first basic sequence are consecutive, the polar channel sequence numbers do not necessarily start from 0, and may start from any integer value. However, storage space is reduced when the polar channel sequence numbers start from 0. Although polar channel sequence numbers in the offset sequence are consecutive, the polar channel sequence numbers do not necessarily start from 0, and may start from any integer value. However, storage space is reduced when the polar channel sequence numbers start from 0.

In one embodiment, the N1 elements including the first indication elements and the first basic elements in the first indication sequence are in a one-to-one correspondence with the N1 first mother code elements in the first mother code sequence.

In one embodiment, when the N1 first mother code elements are ranked in the first mother code sequence in ascending order of reliability of the polar channels indicated by the polar channel sequence numbers indicated by the N1 first mother code elements, correspondingly, the N1 elements including the first indication elements and the first basic elements are ranked in the first indication sequence in ascending order or descending order of reliability of polar channels indicated by polar channel sequence numbers directly or indirectly indicated by the N1 elements including the first indication elements and the first basic elements.

In one embodiment, when the N1 first mother code elements are ranked in the first mother code sequence in descending order of reliability of the polar channels indicated by the polar channel sequence numbers indicated by the N1 first mother code elements, correspondingly, the N1 elements including the first indication elements and the first basic elements are ranked in the first indication sequence in ascending order or descending order of reliability of polar channels indicated by polar channel sequence numbers directly or indirectly indicated by the N1 elements including the first indication elements and the first basic elements.

In one embodiment, before operation S202, the method further includes:

extracting, by the encoding end from a second indication sequence, each second indication element indicating a value less than a maximum value of B and each second indication element indicating a value equal to the maximum value of B; and ranking the second indication elements in an order in which the second indication elements are ranked in the second indication sequence, to form the first indication sequence, where the second indication element indicating the value less than the maximum value of B and the second indication element indicating the value equal to the maximum value of both are used as the first indication elements in the first indication sequence, and in addition to the second indication element indicating the value less than the maximum value of B and the second indication element indicating the value equal to the maximum value of B, the second indication sequence includes a second indication element indicating a value greater than the maximum value of B.

A length of the second indication sequence is greater than that of the first indication sequence. The longer second indication sequence may be generated based on a longer mother code sequence, and then the shorter first indication sequence is generated based on the longer second indication sequence.

In one embodiment, before operation S202, the method further includes:

extracting, by the encoding end from a second basic sequence, each second basic element indicating a value less than F and each second basic element indicating a value equal to F; and ranking the second basic elements in an order in which the second basic elements are ranked in the second basic sequence, to form the first basic sequence, where the second basic element indicating the value less than F and the second basic element indicating the value equal to F both are used as the first basic elements in the first basic sequence, and in addition to the second basic element indicating the value less than F and the second basic element indicating the value equal to F, the second basic sequence includes a second basic element indicating a value greater than F, where F is a positive integer.

The second basic sequence is a sequence whose length is greater than that of the first basic sequence, and the shorter first basic sequence may be generated based on the longer second basic sequence.

In one embodiment, before operation S202, the method further includes:

obtaining, by the encoding end, the first basic element for each third indication element in a third indication sequence based on an association relationship in which $S1=Q1+B1*N3$ when $B1>0$, and $S1=Q1$ when $B1=0$, where $B1$ is a value indicated by the third indication element, N3 is a quantity of third basic elements in a third basic sequence, Q1 is a value indicated by a third basic element corresponding to the third indication element, S1 is a value indicated by the first basic element; and placing the first basic element at a location of the third indication element in the third indication sequence to obtain the first basic sequence, where the N3 third basic elements are used to indicate consecutive N3 polar channel sequence numbers, the N0 first basic elements are used to indicate N0 consecutive polar channel sequence numbers, the N0 polar channel sequence numbers include the N3 polar channel sequence numbers, and the polar channel sequence number is used to indicate a polar channel; the first basic elements are ranked in the first basic sequence in ascending order or descending order of reliability of polar channels indicated by the first basic elements; a quantity of third indication elements in the third indication sequence is N0, and correspondingly, the quantity of first basic elements in the first basic sequence is also N0, where N0 is a positive integer multiple of N3, N3 is $2^P$, and P is a positive integer; and the third indication elements at different locations in the third indication sequence have at least two different values, and correspondingly, B1 also has at least two different values, where B1 is an integer, and the at least two different values are consecutive values starting from 0.

In one embodiment, before operation S202, the method further includes:

obtaining, by the encoding end, the first basic element for each third indication element in a third indication sequence based on an association relationship in which $S1=Q1+B1*N3$, where B1 is a value indicated by the third indication element, N3 is a quantity of third basic elements in the third indication sequence, Q1 is a value indicated by a third basic element corresponding to the third indication element, S1 is a value indicated by the first basic element; and placing the first basic element at a location of the third indication element in the third indication sequence to obtain the first basic sequence, where a total quantity of the third basic elements and the third indication elements in the third indication sequence is N0, the third basic element in the third indication sequence is correspondingly used as the first basic element, and correspondingly, the quantity of first basic elements in the first basic sequence is also N0; the N3 third basic elements are used to indicate consecutive N3 polar channel sequence numbers, the N0 first basic elements in the first basic sequence are used to indicate N0 consecutive polar channel sequence numbers, the N0 polar channel sequence numbers include the N3 polar channel sequence numbers, and the polar channel sequence number is used to indicate a polar channel; the first basic elements are ranked in the first basic sequence in ascending order or descending order of reliability of polar channels indicated by the first basic elements, where N0 is a positive integer multiple of N3, N3 is $2^P$, and P is a positive integer; and the third indication elements at different locations in the third indication sequence have one value or a plurality of different values, and correspondingly, B1 also has one value or a plurality of different values, where B1 is an integer, the plurality of different values of B1 are consecutive values starting from 1, and B1 is 1 when B1 has one value.

In one embodiment, N1 is an even multiple of N0.

According to a third aspect, an embodiment of the present invention provides a data processing apparatus, and the data processing apparatus includes:

an interface module, configured to receive a to-be-encoded data block; and a first encoding module, configured to obtain a first mother code element for each first indication element in a first indication sequence based on an association relationship in which $S=Q+B*N0$ when $B>0$, and $S=Q$ when $B=0$, where B is a value indicated by the first indication element, N0 is a quantity of first basic elements in a first basic sequence, Q is a value indicated by a first basic element corresponding to the first indication element, and S is a value indicated by the first mother code element; and place the first mother code element at a location of the first indication element in the first indication sequence to obtain a first mother code sequence, where the N0 first basic elements in the first basic sequence are used to indicate N0 consecutive polar channel sequence numbers, N1 first mother code elements in the first mother code sequence are used to indicate N1 consecutive polar channel sequence numbers, the N1 polar channel sequence numbers include the N0 polar channel sequence numbers, and the polar channel sequence number is used to indicate a polar channel; the first mother code elements are ranked in the first mother code sequence in ascending order or descending order of reliability of polar channels indicated by the first mother code elements, where N1 is a positive integer multiple of N0, N0 equals to $2^x$, N1 equals to $2^y$, and X and Y both are positive integers; and the first indication elements at different locations in the first indication sequence have at least two different values, and correspondingly, B also has at least two different values, where B is an integer, and the at least two different values are consecutive values starting from 0, where the first encoding module is further configured to encode the data block in a polar encoding manner by using the first mother code sequence; and the interface module is further configured to output a result obtained after the data block is encoded.

In one embodiment, that the N0 first basic elements are used to indicate N0 consecutive polar channel sequence numbers, and N1 first mother code elements are used to indicate N1 consecutive polar channel sequence numbers means the following:

the N0 first basic elements are used to indicate polar channel sequence numbers from W to W+N0−1, and the N1 first mother code elements are used to indicate polar channel sequence numbers from W to W+N1−1, where W is an integer greater than or equal to 0; or in other words, the polar channel sequence numbers indicated by the N0 first basic elements are integers in [W, W+N0−1], and the polar channel sequence numbers indicated by the N1 first mother code elements are integers in [W, W+N1−1], for example, the N0 first basic elements are used to indicate polar channel sequence numbers from 0 to N0−1, and the N1 first mother code elements are used to indicate polar channel sequence numbers from 0 to N1−1.

Although the polar channel sequence numbers indicated by the N1 first mother code elements in the first mother code sequence are consecutive, the polar channel sequence numbers do not necessarily start from 0, and may start from any integer value. However, storage space is reduced when the polar channel sequence numbers start from 0. Although the polar channel sequence numbers indicated by the N0 first basic elements in the first basic sequence are consecutive, the polar channel sequence numbers do not necessarily start from 0, and may start from any integer value. However, storage space is reduced when the polar channel sequence numbers start from 0. Although polar channel sequence numbers in the offset sequence are consecutive, the polar channel sequence numbers do not necessarily start from 0, and may start from any integer value. However, storage space is reduced when the polar channel sequence numbers start from 0.

In one embodiment, N1 first indication elements in the first indication sequence are in a one-to-one correspondence with the N1 first mother code elements in the first mother code sequence.

In one embodiment, when the N1 first mother code elements are ranked in the first mother code sequence in ascending order of reliability of the polar channels indicated by the polar channel sequence numbers indicated by the N1 first mother code elements, correspondingly, N1 first indication elements in the first indication sequence are ranked in ascending order or descending order of reliability of polar channels indicated by polar channel sequence numbers indirectly indicated by the N1 first indication elements, and the N0 first basic elements are ranked in the first basic sequence in ascending order or descending order of reliability of polar channels indicated by the polar channel sequence numbers indicated by the N0 basic elements.

In one embodiment, when the N1 first mother code elements are ranked in the first mother code sequence in descending order of reliability of the polar channels indicated by the polar channel sequence numbers indicated by the N1 first mother code elements, correspondingly, N1 first indication elements in the first indication sequence are ranked in descending order or ascending order of reliability of polar channels indicated by polar channel sequence numbers indirectly indicated by the N1 first indication elements, and the N0 first basic elements are ranked in the first basic sequence in ascending order or descending order of reliability of polar channels indicated by the polar channel sequence numbers indicated by the N0 first basic elements.

In one embodiment, the first encoding module is further configured to:

extract, from a second indication sequence, each second indication element indicating a value less than a maximum value of B and each second indication element indicating a value equal to the maximum value of B; and rank the second indication elements in an order in which the second indication elements are ranked in the second indication sequence, to form the first indication sequence, where the second indication element indicating the value less than the maximum value of B and the second indication element indicating the value equal to the maximum value of B both are used as the first indication elements in the first indication sequence, and in addition to the second indication element indicating the value less than the maximum value of B and the second indication element indicating the value equal to the maximum value of B, the second indication sequence includes a second indication element indicating a value greater than the maximum value of B.

A length of the second indication sequence is greater than that of the first indication sequence. The longer second indication sequence may be generated based on a longer mother code sequence, and then the shorter first indication sequence is generated based on the longer second indication sequence.

In one embodiment, the first encoding module is further configured to:

extract, from a second basic sequence, each second basic element indicating a value less than F and each second basic element indicating a value equal to F; and rank the second basic elements in an order in which the second basic elements are ranked in the second basic sequence, to form the first basic sequence, where the second basic element indicating the value less than F and the second basic element indicating the value equal to F both are used as the first basic elements in the first basic sequence, and in addition to the second basic element indicating the value less than F and the second basic element indicating the value equal to F, the second basic sequence includes a second basic element indicating a value greater than F, where F is a positive integer.

The second basic sequence is a sequence whose length is greater than that of the first basic sequence, and the shorter first basic sequence may be generated based on the longer second basic sequence.

In one embodiment, the first encoding module is further configured to:

obtain the first basic element for each third indication element in a third indication sequence based on an association relationship in which $S1=Q1+B1*N3$ when $B1>0$, and $S1=Q1$ when $B1=0$, where B1 is a value indicated by the third indication element, N3 is a quantity of third basic elements in a third basic sequence, Q1 is a value indicated by a third basic element corresponding to the third indication element, S1 is a value indicated by the first basic element; and place the first basic element at a location of the third indication element in the third indication sequence to obtain the first basic sequence, where the N3 third basic elements are used to indicate consecutive N3 polar channel sequence numbers, the N0 first basic elements are used to indicate N0 consecutive polar channel sequence numbers, the N0 polar channel sequence numbers include the N3 polar channel sequence numbers, and the polar channel sequence number is used to indicate a polar channel; the first basic elements are ranked in the first basic sequence in ascending order or descending order of reliability of polar channels indicated by the first basic elements; a quantity of third indication elements in the third indication sequence is N0, and correspondingly, the quantity of first basic elements in the first basic sequence is also N0, where N0 is a positive integer multiple of N3, N3 is $2^P$, and P is a positive integer; and the third indication elements at different locations in the third indication sequence have at least two different values, and correspondingly, B1 also has at least two different values, where B1 is an integer, and the at least two different values are consecutive values starting from 0.

In one embodiment, the first encoding module is further configured to:

obtain the first basic element for each third indication element in a third indication sequence based on an association relationship in which $S1=Q1+B1*N3$, where B1 is a value indicated by the third indication element, N3 is a quantity of third basic elements in the third indication sequence, Q1 is a value indicated by a third basic element corresponding to the third indication element, S1 is a value indicated by the first basic element; and place the first basic element at a location of the third indication element in the third indication sequence to obtain the first basic sequence, where a total quantity of the third basic elements and the third indication elements in the third indication sequence is N0, the third basic element in the third indication sequence is correspondingly used as the first basic element, and correspondingly, the quantity of first basic elements in the first basic sequence is also N0; the N3 third basic elements are used to indicate consecutive N3 polar channel sequence numbers, the N0 first basic elements in the first basic sequence are used to indicate N0 consecutive polar channel sequence numbers, the N0 polar channel sequence numbers include the N3 polar channel sequence numbers, and the polar channel sequence number is used to indicate a polar channel; the first basic elements are ranked in the first basic sequence in ascending order or descending order of reliability of polar channels indicated by the first basic elements, where N0 is a positive integer multiple of N3, N3 is $2^P$, and P is a positive integer; and the third indication elements at different locations in the third indication sequence have one value or a plurality of different values, and correspondingly, B1 also has one value or a plurality of different values, where B1 is an integer, the plurality of different values of B1 are consecutive values starting from 1, and B1 is 1 when B1 has one value.

In one embodiment, N1 is an even multiple of N0.

According to a fourth aspect, an embodiment of the present invention further provides another data processing apparatus, and the data processing apparatus includes: a transceiver module, configured to receive a to-be-encoded data block; and a second encoding module, configured to: obtain a first mother code element for each first indication element in a first indication sequence based on an association relationship in which $S=Q+B*N0$, where B is a value indicated by the first indication element, N0 is a quantity of first basic elements in the first indication sequence, Q is a value indicated by a first basic element corresponding to the first indication element, and S is a value indicated by the first mother code element; and place the first mother code element at a location of the first indication element in the first indication sequence to obtain a first mother code sequence, where the N0 first basic elements are used to indicate N0 consecutive polar channel sequence numbers; a total quantity of the first indication elements and the first basic elements in the first indication sequence is N1, and correspondingly, a total quantity of the first mother code elements and the first basic elements in the first mother code sequence is also N1; the N1 elements including the first mother code elements and the first basic elements are used to indicate N1 consecutive polar channel sequence numbers, the N1 polar channel sequence numbers include the N0 polar channel sequence numbers, and the polar channel sequence number is used to indicate a polar channel; the first mother code elements and the first basic elements are ranked in the first mother code sequence in ascending order or descending order of reliability of polar channels indicated by the first mother code elements and the first basic elements, where N1 is a positive integer multiple of N0, N0 equals to $2^x$, N1 equals to $2^y$, and X and Y both are positive integers; and the first indication elements at different locations in the first indication sequence have one value or a plurality of different values, and correspondingly, B also has one value or a plurality of different values, where B is an integer, the plurality of different values of B are consecutive values starting from 1, and B is 1 when B has one value, where the second encoding module is further configured to encode the data block in a polar encoding manner by using the first mother code sequence; and the transceiver module is further configured to output a result obtained after the data block is encoded.

In one embodiment, that the N0 first basic elements are used to indicate N0 consecutive polar channel sequence numbers, and N1 first mother code elements are used to indicate N1 consecutive polar channel sequence numbers means the following:

the N0 first basic elements are used to indicate polar channel sequence numbers from W to W+N0−1, and the N1 first mother code elements are used to indicate polar channel sequence numbers from W to W+N1−1, where W is an integer greater than or equal to 0; or in other words, the polar channel sequence numbers indicated by the N0 first basic elements are integers in [W, W+N0−1], and the polar channel sequence numbers indicated by the N1 first mother code elements are integers in [W, W+N1−1], for example, the N0 first basic elements are used to indicate polar channel sequence numbers from 0 to N0−1, and the N1 first mother code elements are used to indicate polar channel sequence numbers from 0 to N1−1.

Although the polar channel sequence numbers indicated by the N1 first mother code elements in the first mother code sequence are consecutive, the polar channel sequence numbers do not necessarily start from 0, and may start from any integer value. However, storage space is reduced when the polar channel sequence numbers start from 0. Although the polar channel sequence numbers indicated by the N0 first basic elements in the first basic sequence are consecutive, the polar channel sequence numbers do not necessarily start from 0, and may start from any integer value. However, storage space is reduced when the polar channel sequence numbers start from 0. Although polar channel sequence numbers in the offset sequence are consecutive, the polar channel sequence numbers do not necessarily start from 0, and may start from any integer value. However, storage space is reduced when the polar channel sequence numbers start from 0.

In one embodiment, the N1 elements including the first indication elements and the first basic elements in the first indication sequence are in a one-to-one correspondence with the N1 first mother code elements in the first mother code sequence.

In one embodiment, when the N1 first mother code elements are ranked in the first mother code sequence in ascending order of reliability of the polar channels indicated by the polar channel sequence numbers indicated by the N1 first mother code elements, correspondingly, the N1 elements including the first indication elements and the first basic elements are ranked in the first indication sequence in ascending order or descending order of reliability of polar channels indicated by polar channel sequence numbers directly or indirectly indicated by the N1 elements including the first indication elements and the first basic elements.

In one embodiment, when the N1 first mother code elements are ranked in the first mother code sequence in descending order of reliability of the polar channels indicated by the polar channel sequence numbers indicated by the N1 first mother code elements, correspondingly, the N1 elements including the first indication elements and the first basic elements are ranked in the first indication sequence in ascending order or descending order of reliability of polar channels indicated by polar channel sequence numbers directly or indirectly indicated by the N1 elements including the first indication elements and the first basic elements.

In one embodiment, the second encoding module is further configured to:

extract, from a second indication sequence, each second indication element indicating a value less than a maximum value of B and each second indication element indicating a value equal to the maximum value of B; and rank the second indication elements in an order in which the second indication elements are ranked in the second indication sequence, to form the first indication sequence, where the second indication element indicating the value less than the maximum value of B and the second indication element indicating the value equal to the maximum value of B both are used as the first indication elements in the first indication sequence, and in addition to the second indication element indicating the value less than the maximum value of B and the second indication element indicating the value equal to the maximum value of B, the second indication sequence includes a second indication element indicating a value greater than the maximum value of B.

A length of the second indication sequence is greater than that of the first indication sequence. The longer second indication sequence may be generated based on a longer mother code sequence, and then the shorter first indication sequence is generated based on the longer second indication sequence.

In one embodiment, the second encoding module is further configured to:

extract, from a second basic sequence, each second basic element indicating a value less than F and each second basic element indicating a value equal to F; and rank the second basic elements in an order in which the second basic elements are ranked in the second basic sequence, to form the first basic sequence, where the second basic element indicating the value less than F and the second basic element indicating the value equal to F both are used as the first basic elements in the first basic sequence, and in addition to the second basic element indicating the value less than F and the second basic element indicating the value equal to F, the second basic sequence includes a second basic element indicating a value greater than F, where F is a positive integer.

The second basic sequence is a sequence whose length is greater than that of the first basic sequence, and the shorter first basic sequence may be generated based on the longer second basic sequence.

In one embodiment, the second encoding module is further configured to:

obtain the first basic element for each third indication element in a third indication sequence based on an association relationship in which $S1=Q1+B1*N3$ when $B1>0$, and $S1=Q1$ when $B1=0$, where B1 is a value indicated by the third indication element, N3 is a quantity of third basic elements in a third basic sequence, Q1 is a value indicated by a third basic element corresponding to the third indication element, S1 is a value indicated by the first basic element; and place the first basic element at a location of the third indication element in the third indication sequence to obtain the first basic sequence, where the N3 third basic elements are used to indicate consecutive N3 polar channel sequence numbers, the N0 first basic elements are used to indicate N0 consecutive polar channel sequence numbers, the N0 polar channel sequence numbers include the N3 polar channel sequence numbers, and the polar channel sequence number is used to indicate a polar channel; the first basic elements are ranked in the first basic sequence in ascending order or descending order of reliability of polar channels indicated by the first basic elements; a quantity of third indication elements in the third indication sequence is N0, and correspondingly, the quantity of first basic elements in the first basic sequence is also N0, where N0 is a positive integer multiple of N3, N3 is $2^P$, and P is a positive integer; and the third indication elements at different locations in the third indication sequence have at least two different values, and correspondingly, B1 also has at least two different values, where B1 is an integer, and the at least two different values are consecutive values starting from 0.

In one embodiment, the second encoding module is further configured to:

obtain the first basic element for each third indication element in a third indication sequence based on an association relationship in which $S1=Q1+B1*N3$, where B1 is a value indicated by the third indication element, N3 is a quantity of third basic elements in the third indication sequence, Q1 is a value indicated by a third basic element corresponding to the third indication element, S1 is a value indicated by the first basic element; and place the first basic element at a location of the third indication element in the third indication sequence to obtain the first basic sequence, where a total quantity of the third basic elements and the third indication elements in the third indication sequence is N0, the third basic element in the third indication sequence is correspondingly used as the first basic element, and correspondingly, the quantity of first basic elements in the first basic sequence is also N0; the N3 third basic elements are used to indicate consecutive N3 polar channel sequence numbers, the N0 first basic elements in the first basic sequence are used to indicate N0 consecutive polar channel sequence numbers, the N0 polar channel sequence numbers include the N3 polar channel sequence numbers, and the polar channel sequence number is used to indicate a polar channel; the first basic elements are ranked in the first basic sequence in ascending order or descending order of reliability of polar channels indicated by the first basic elements, where N0 is a positive integer multiple of N3, N3 is $2^P$, and P is a positive integer; and the third indication elements at different locations in the third indication sequence have one value or a plurality of different values, and correspondingly, B1 also has one value or a plurality of different values, where B1 is an integer, the plurality of different values of B1 are consecutive values starting from 1, and B1 is 1 when B1 has one value.

In one embodiment, N1 is an even multiple of N0.

According to a fifth aspect, an embodiment of the present invention provides a communications apparatus, and the communications apparatus includes a processor and a memory interconnected to the processor. When the communications apparatus runs, the processor reads and executes an instruction in the memory or runs a hardware logic circuit of the processor, so that the communications apparatus performs embodiments of any one of the data processing methods in the first and the second aspect.

In one embodiment, the memory is configured to store the instruction, and the memory may be independent of the processor, or may be integrated into the processor.

In one embodiment, the communications apparatus may further include a transceiver, configured to receive and/or send data.

Another aspect of the embodiments of this application further provides a computer-readable storage medium. The computer-readable storage medium stores an instruction, and when the instruction runs on a computer, the computer performs the methods described in the foregoing aspects.

Another aspect of the embodiments of this application further provides a computer program product including an instruction, and when the instruction runs on a computer, the computer performs the methods described in the foregoing aspects.

BRIEF DESCRIPTION OF DRAWINGS

FIG. 5 is a schematic diagram of an indication sequence constructed in a first construction manner according to an embodiment of the present invention;

FIG. 6 is a schematic diagram of directly storing the mother code sequence according to an embodiment of the present invention;

FIG. 7 is a schematic diagram of an indication sequence constructed when a basic sequence different from that in FIG. 5 is used according to an embodiment of the present invention;

FIG. 8 is a schematic diagram of an indication sequence constructed in a second construction manner according to an embodiment of the present invention;

FIG. 9 is a schematic diagram of an indication sequence constructed in a second construction manner when a basic sequence different from that in FIG. 8 is used according to an embodiment of the present invention;

DESCRIPTION OF EMBODIMENTS

The embodiments of the present invention may be applied to various communications systems, for example, a wireless communications system. Therefore, the following descriptions are not limited to a specific communications system. The various communications systems include a global system for mobile communications (GSM), a code division multiple access (CDMA system, a wideband code division multiple access (WCDMA) system, a general packet radio service (GPRS), a long term evolution (LTE) system, an LTE frequency division duplex (FDD) system, an LTE time division duplex (TDD) system, a universal mobile telecommunications system (UMTS), and the like. All information or data encoded by a base station or a terminal in the foregoing system by using a conventional turbo code and LDPC code can be encoded by using a polar code in the embodiments.

The base station may be a device configured to communicate with a terminal device. For example, the base station may be a base transceiver station (Base Transceiver Station, BTS) in a GSM system or a CDMA system, may be a NodeB (NB) in a WCDMA system, or may be an evolved NodeB (Evolutional Node B, eNB or eNodeB) in an LTE system. Alternatively, the base station may be a relay station, an access point, an in-vehicle device, a wearable device, a network-side device in a future 5G network, or the like.

The terminal may communicate with one or more core networks by using a radio access network (RAN). The terminal may be user equipment (UE), a terminal, a subscriber unit, a subscriber station, a mobile station, a mobile console, a remote station, a remote terminal, a mobile device, a user terminal, a wireless communications device, a user agent, or a user apparatus. The terminal may be a cellular phone, a cordless telephone set, a session initiation protocol (SIP) phone, a wireless local loop (WLL) station, a personal digital assistant (PDA), a handheld device having a wireless communication function, a computing device or another processing device connected to a wireless modem, an in-vehicle device, a wearable device, a terminal device in a future 5G network, or the like.

Figure 1:
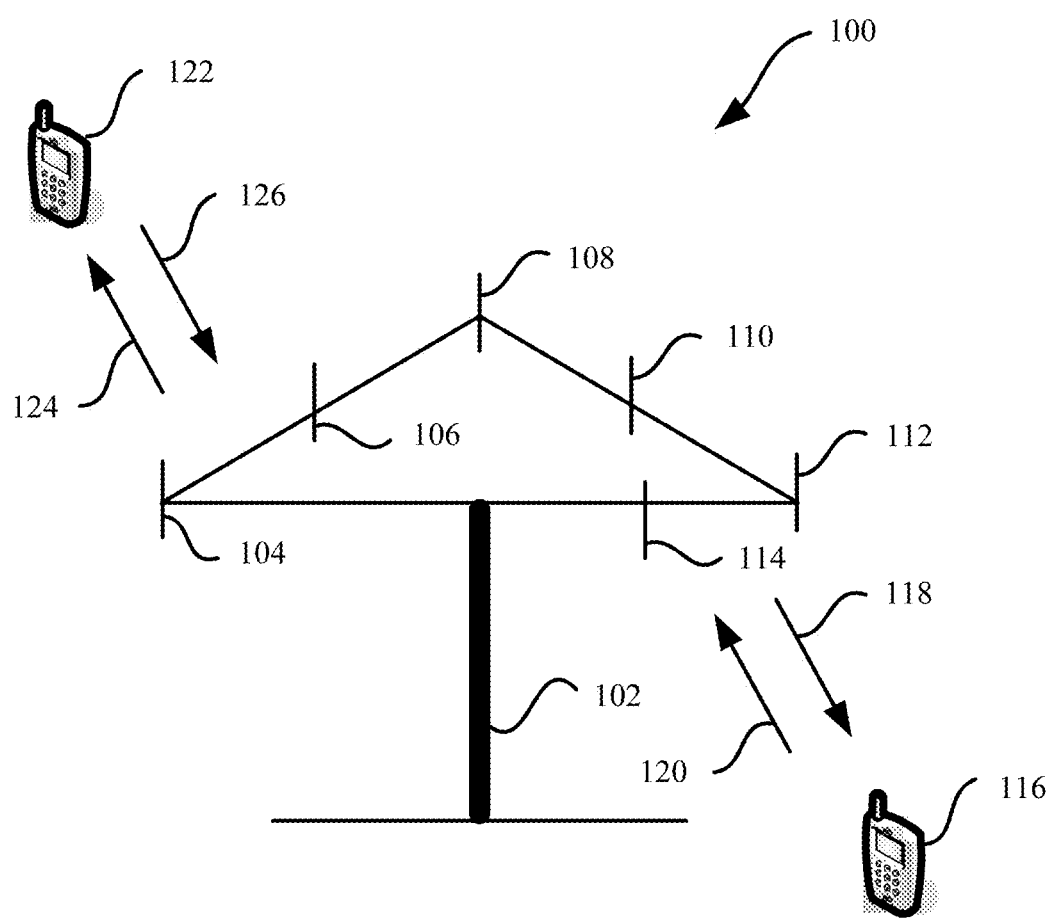
FIG. 1 is a schematic diagram of a wireless communications system according to an embodiment of the present invention.

The communications system in the embodiments of this specification may be a wireless communications system. FIG. 1 shows a wireless communications system 100. The system 100 includes a base station 102, and the base station may include a plurality of antenna groups. For example, one antenna group may include antennas 104 and 106, another antenna group may include antennas 108 and 110, and an additional group may include antennas 112 and 114. Two antennas are shown for each antenna group. However, more or fewer antennas may be used for each group. The base station 102 may include a transmitter chain and a receiver chain. A person of ordinary skill in the art may understand that the transmitter chain and the receiver chain each may include a plurality of components related to signal sending and receiving, for example, a processor, a modulator, a multiplexer, a demodulator, a demultiplexer, or an antenna.

The base station 102 may communicate with one or more terminals, such as a terminal 116 and a terminal 122. However, it may be understood that the base station 102 may communicate with any quantity of terminals similar to the terminals 116 and 122. The terminals 116 and 122 each may be, for example, a cellular phone, a smartphone, a portable computer, a handheld communications device, a handheld computing device, a satellite radio apparatus, a global positioning system, a PDA, and/or any other suitable device used for communication in the wireless communications system 100. As shown in the figure, the terminal 116 communicates with the antennas 112 and 114. The antennas 112 and 114 send information to the terminal 116 by using a forward link 118, and receive information from the terminal 116 by using a reverse link 120. In addition, the terminal 122 communicates with the antennas 104 and 106. The antennas 104 and 106 send information to the terminal 122 by using a forward link 124, and receive information from the terminal 122 by using a reverse link 126. In a frequency division duplex (Frequency Division Duplex, "FDD" for short) system, for example, the forward link 118 may use a frequency band different from that used by the reverse link 120, and the forward link 124 may use a frequency band different from that used by the reverse link 126. In addition, in a time division duplex (Time Division Duplex, "TDD" for short) system, the forward link 118 and the reverse link 120 may use a same frequency band, and the forward link 124 and the reverse link 126 may use a same frequency band.

Each antenna group or each area or both designed for communication are referred to as sectors of the base station 102. For example, an antenna group may be designed to communicate with a terminal in a sector of an area covered by the base station 102. During communication through the forward links 118 and 124, a transmit antenna of the base station 102 may increase signal-to-noise ratios of the forward links 118 and 124 for the terminals 116 and 122 through beamforming. In addition, compared with a case in which a base station performs sending to all terminals of the base station by using a single antenna, when the base station 102 performs, through beamforming, sending to the terminals 116 and 122 that are randomly scattered in the related coverage area, less interference is caused to a mobile device in a neighboring cell.

At a given time, the base station 102, the terminal 116, and/or the terminal 122 may be wireless communications sending apparatuses and/or wireless communications receiving apparatuses. When sending data, the wireless communications sending apparatus may encode the data for transmission. In one embodiment, the wireless communications sending apparatus needs to send a specific quantity of information bits to the wireless communication receiving apparatus through a channel. The information bits may be included in a transport block or a plurality of transport blocks of data, and the transport block may be segmented to generate a plurality of code blocks. In addition, the wireless communications sending apparatus may encode each code block by using a polar code encoder, so as to improve data transmission reliability, thereby ensuring communication quality.

A communications system usually improves data transmission reliability through channel encoding, to ensure communication quality. A polar (Polar) code is an encoding manner that theoretically proves that the polar code can obtain a Shannon capacity and has a simple encoding and decoding method. The polar code is a linear block code. A generation matrix of the polar code is $G_N$, and an encoding process of the polar code is $x_1^N = u_1^N G_N$, where $u_1^N = (u_1, u_2, K, u_N)$ is a binary row vector, $G_N = F_2^{\otimes(log_2(N))}$, a code length $N = 2^n$, and n is a positive integer.

$$F_2 = \begin{bmatrix} 1 & 0 \\ 1 & 1 \end{bmatrix}, F_2^{\otimes(log_2(N))}$$

is a Kronecker product of $F_2$ and is defined as follows: $F^{\otimes(log_2(N))} = F \otimes F^{\otimes((log_2(N))-1)}$.

In the encoding process of the polar code, some bits in $u_1^N$ are used to carry information and are referred to as information bits. A set of sequence numbers of the information bits is denoted as A. The other bits are set to fixed values that are agreed on by a transmit end and a receive end in advance and are referred to as fixed bits, and a set of sequence numbers of the fixed bits is denoted by using a complementary set $A^c$ of A. The fixed bits are usually set to 0. Actually, a fixed bit sequence may be randomly set provided that the transmit end and the receive end agree in advance. Therefore, an encoded bit sequence of the polar code may be obtained by using the following method: $x_1^N = u_A G_N(A)$. Herein, $u_A$ is a set of information bits in $u_1^N$; $u_A$ is a row vector with a length of K, that is, $|A|=K$; $|\bullet|$ indicates a quantity of elements in the set, that is, K indicates a quantity of elements in the set A; $G_N(A)$ is a sub-matrix that is in the matrix $G_N$ and that is obtained by using rows corresponding to indexes in the set A; and $G_N(A)$ is a K×N matrix. In a CRC (Cyclic Redundancy Check, cyclic redundancy check) assisted enhanced SC (Successive Cancellation Decoding, successive cancellation decoding) decoding algorithm, the polar code may gain FER (frame error rate, frame error rate) performance better than that of an LDPC (low-density parity-check code, low-density parity-check code) and a turbo code.

Figure 2:
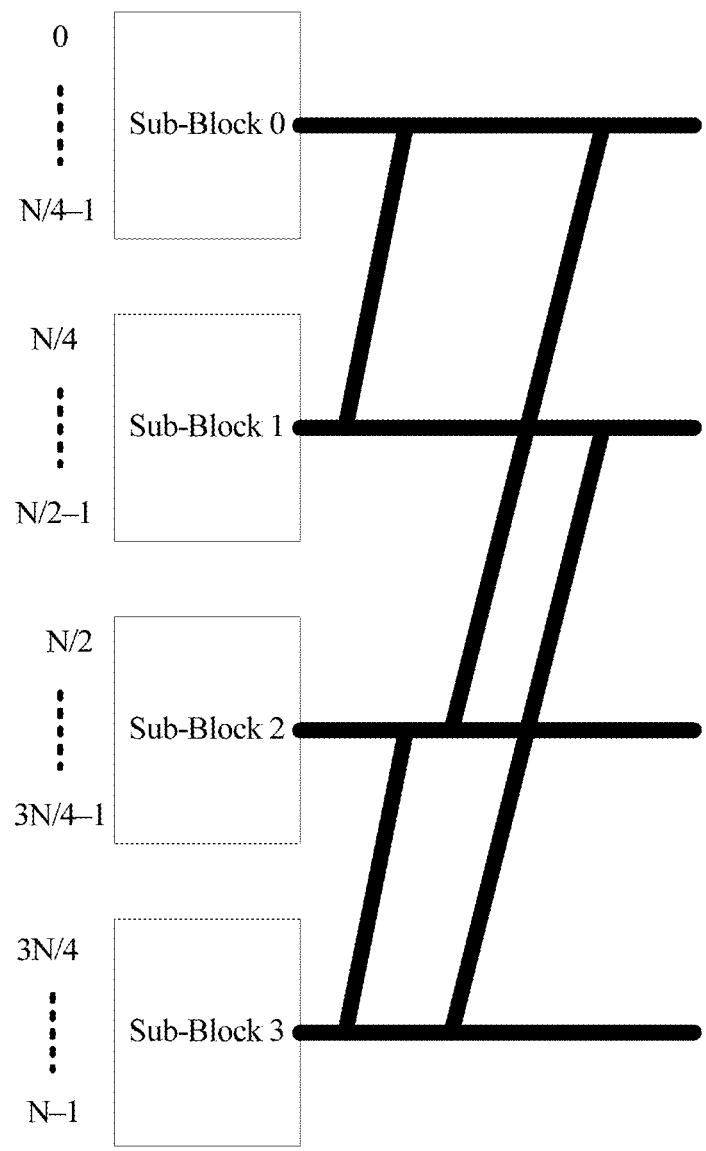
FIG. 2 is a schematic diagram of polar channel ranking according to an embodiment of the present invention.

As shown in FIG. 2, in the encoding process of the polar code, it may be learned from a channel polarization process that for N polar channels, if each polar channel is indicated by using a channel sequence number, polar channels $$\left\{ \frac{N}{2}, \frac{N}{2}+1, \frac{N}{2}+2, \ldots, N = 2^n - 1 \right\}$$

are a polarization process of polar channels $$\left\{0, 1, 2, \ldots, \frac{N}{2} - 1 = 2^{n-1} - 1\right\}.$$

Orders of the two groups of polar channels are consistent with each other. In the ranking order, a difference between two values at locations corresponding to each other is $$\frac{N}{2}.$$

If the two sequences are considered as two segments of a longer mother code sequence of the polar code, for example, the two segments are referred to as a zeroth segment and a first segment, and a length of each segment is referred to as a segment length, only an order of one of the two sequences and a relationship between values at locations corresponding to each other in the first segment and the zeroth segment need to be stored, because the orders of the segments are consistent with each other, and a difference between values of elements corresponding to each other is an integer multiple of the segment length. The process may be further decomposed to divide the mother code sequence of the polar code into four segments, and a shorter mother code sequence of the polar code is used. For example, a sequence $$\left\{0, 1, 2, \ldots, \frac{N}{4} - 1 = 2^{n-2} - 1\right\}$$

is used as a basic sequence, and the other sequences each stores a difference between elements at locations corresponding to each other in the sequence and the basic sequence. For example, $$\left\{\frac{N}{4}, \frac{N}{4} + 1, \frac{N}{4} + 2, \ldots, 2^{n-1} - 1\right\}$$

belongs to the first segment, $$\left\{\frac{N}{2}, \frac{N}{2} + 1, \frac{N}{2} + 2, \ldots, \frac{3N}{4} - 1\right\}$$

belongs to a second segment, and $$\left\{\frac{3N}{4}, \frac{3N}{4} + 1, \frac{3N}{4} + 2, \ldots, N - 1\right\}$$

belongs to a third segment. Differences between values of elements and values of corresponding elements in the basic sequence are respectively one multiple, two multiples, and three multiples of a segment length N/4. For example, a difference between each element in the sequence $$\left\{\frac{N}{4}, \frac{N}{4} + 1, \frac{N}{4} + 2, \ldots, 2^{n-1} - 1\right\}$$

and an element at a corresponding location in the basic sequence is $$\frac{N}{4},$$

and a difference between elements at locations corresponding to each other in the sequence $$\left\{\frac{N}{2}, \frac{N}{2} + 1, \frac{N}{2} + 2, \ldots, \frac{3N}{4} - 1\right\}$$

and the basic sequence is $$\frac{N}{2}.$$

It may be learned that each difference is an integer multiple of the sequence length.

Therefore, in the embodiments of the present invention, according to a rule summarized above, a basic sequence may be determined in a mother code sequence, and an indication sequence may be determined based on the mother code sequence. A difference between the indication sequence and the mother code sequence lies in that the mother code sequence stores a channel sequence number, but the indication sequence stores an offset difference (multiple) between each channel sequence number and a channel sequence number in the basic sequence. In addition, although content stored in the mother code sequence and content stored in the indication sequence are different, in a ranking order, a location in the mother code sequence and the same location in the indication sequence indicate a same channel. For example, starting from a start location in the mother code sequence, channel sequence numbers are ranked in descending order of channel reliability. Correspondingly, starting from a start location in the indication sequence, offset multiples between the channel sequence numbers and channel sequence numbers at corresponding locations in the basic sequence are ranked in descending order of channel reliability. Specifically, for example, a fifth location from the start location in the mother code sequence indicates a channel with a sequence number 8. Correspondingly, a fifth location from the start location in the indication sequence indicates an offset multiple 1 between the channel whose sequence number is 8 and a sequence number in the basic sequence.

During polar code encoding, a mother code sequence is a sequence that needs to be obtained according to a polar encoding requirement, and a length of the mother code sequence is consistent with a quantity of polar channels. A length N of the mother code sequence may be a maximum mother code length that can be supported by a system, or may be any length less than the maximum mother code length, where $N=2^n$, and n is a non-negative integer.

If the length of the mother code sequence is N, correspondingly, there are N polar channels. The N polar channels are in a one-to-one correspondence with N metric values, and each metric value is used to indicate reliability of a polar channel corresponding to the metric value. Reliability of the N polar channels are ranked based on the N metric values, and a ranking result is recorded by using polar channel sequence numbers, to obtain the mother code sequence. To be specific, the mother code sequence includes N sequence numbers, and an order of the N sequence numbers indicates an order of reliability of the N polar channels.

A metric value of polar channel reliability may be calculated by using a method in the prior art, such as density evolution, Gaussian approximation, or linear fitting. In one embodiment, parameters such as an error probability, a channel capacity, and a polarization weight may be used as metric values for measuring polar channel reliability, or another parameter that can measure polar channel reliability may be used as a metric value for measuring polar channel reliability.

How to obtain the basic sequence and the indication sequence is described below in detail.

S101. Obtain a mother code sequence with a length of N based on a reliability order of N polar channels, where N is a positive integer.

The mother code sequence is used to indicate the reliability order of the N polar channels, and each element in the mother code sequence indicates each polar channel. Each element in the mother code sequence may be indicated by using a polar channel sequence number or another polar channel parameter. In this embodiment, each element in the mother code sequence is indicated by using a polar channel sequence number. The N elements in the mother code sequence are used to indicate polar channel sequence numbers from T to T+N−1, and T is an integer greater than or equal to 0. For example, the N elements are used to indicate polar channel sequence numbers from 0 to N−1. In other words, forms for indicating the polar channel sequence numbers in the mother code sequence are flexible. Although the polar channel sequence numbers are consecutive, the polar channel sequence numbers do not necessarily start from 0, and may start from any value. However, storage space is reduced when the polar channel sequence numbers start from 0.

S102. Extract an order of polar channels whose sequence numbers are less than M from the mother code sequence, to form a basic sequence, and divide sequence numbers greater than or equal to the sequence number M in the mother code sequence into L offset sequences whose lengths each are equal to that of the basic sequence, where a quantity of polar channels whose sequence numbers are less than M in the mother code sequence is N0, a quantity of polar channels whose sequence numbers are greater than or equal to M in the mother code sequence is an integer multiple of N0, and L is an integer greater than 0.

A quantity of polar channel sequence numbers included in each offset sequence is the same as a quantity of polar channel sequence numbers included in the basic sequence. There is a common offset multiple between a plurality of sequence numbers in each offset sequence and sequence numbers at corresponding locations in the basic sequence. When polar channel sequence numbers in the mother code sequence are ranked in descending order of polar channel reliability, the polar channel sequence numbers in the offset sequence may be ranked in descending order of polar channel reliability or in ascending order of polar channel reliability, and the polar channel sequence numbers in the basic sequence may also be ranked in descending order of polar channel reliability or in ascending order of polar channel reliability.

Alternatively, when polar channel sequence numbers in the mother code sequence are ranked in ascending order of polar channel reliability, the polar channel sequence numbers in the offset sequence may be ranked in descending order of polar channel reliability or in ascending order of polar channel reliability, and the polar channel sequence numbers in the basic sequence may be ranked in descending order of polar channel reliability or in ascending order of polar channel reliability.

In other words, a ranking rule of the polar channel sequence numbers in the mother code sequence may be the same as or different from a ranking rule of the polar channel sequence numbers in the offset sequence, and the ranking rule of the polar channel sequence numbers in the mother code sequence may be the same as or different from a ranking rule of the polar channel sequence numbers in the basic sequence.

S103. Indicate an order of the polar channel sequence numbers in the mother code sequence by using an indication sequence; fill in, at a location that is in the indication sequence and that is of a sequence number in the basic sequence, information indicating an offset multiple between the sequence number at this location and the same sequence number in the basic sequence; and fill in, at a location that is in the indication sequence and that is of a sequence number in the offset sequence, information indicating an offset multiple between the sequence number at this location and a corresponding sequence number in the basic sequence.

Alternatively, operation S103 may be replaced with the following: An order of the polar channel sequence numbers in the mother code sequence is indicated by using an indication sequence; a sequence number in the basic sequence is still placed at a location that is in the indication sequence and that is of the sequence number in the basic sequence; and at a location that is in the indication sequence and that is of a sequence number in the offset sequence, information indicating an offset multiple between the sequence number at this location and a corresponding sequence number in the basic sequence is filled in.

Concepts or implementations described above are applicable to any one of the following embodiments.

In the following embodiments, to distinguish between an element in a mother code sequence, an element in an indication sequence, and an element in a basic sequence, the element in the mother code sequence is referred to as a mother code element, the element in the indication sequence is referred to as an indication element, and the element in the basic sequence is referred to as a basic element. A plurality of different mother code sequences are respectively referred to as a first mother code sequence and a second mother code sequence, and elements in the plurality of different mother code sequences are respectively referred to as a first mother code element and a second mother code element. A plurality of different indication sequences are respectively referred to as a first indication sequence, a second indication sequence, and a third indication sequence, and elements in the plurality of different indication sequences are respectively referred to as a first indication element, a second indication element, and a third indication element. A plurality of different basic sequences are respectively referred to as a first basic sequence, a second basic sequence, and a third basic sequence, and elements in the plurality of different basic sequences are respectively referred to as a first basic element, a second basic element, and a third basic element. The mother code sequence, the first mother code sequence, and the second mother code sequence may have different lengths. Mutual reference may be made to specific implementations of the mother code sequence, the first mother code sequence, and the second mother code sequence. The indication sequence, the first indication sequence, the second indication sequence, and the third indication sequence may have different lengths. Mutual reference may be made to specific implementations of the indication sequence, the first indication sequence, the second indication sequence, and the third indication sequence. The basic sequence, the first basic sequence, the second basic sequence, and the third basic sequence may have different lengths. Mutual reference may be made to specific implementations of the basic sequence, the first basic sequence, the second basic sequence, and the third basic sequence.

Figure 3:
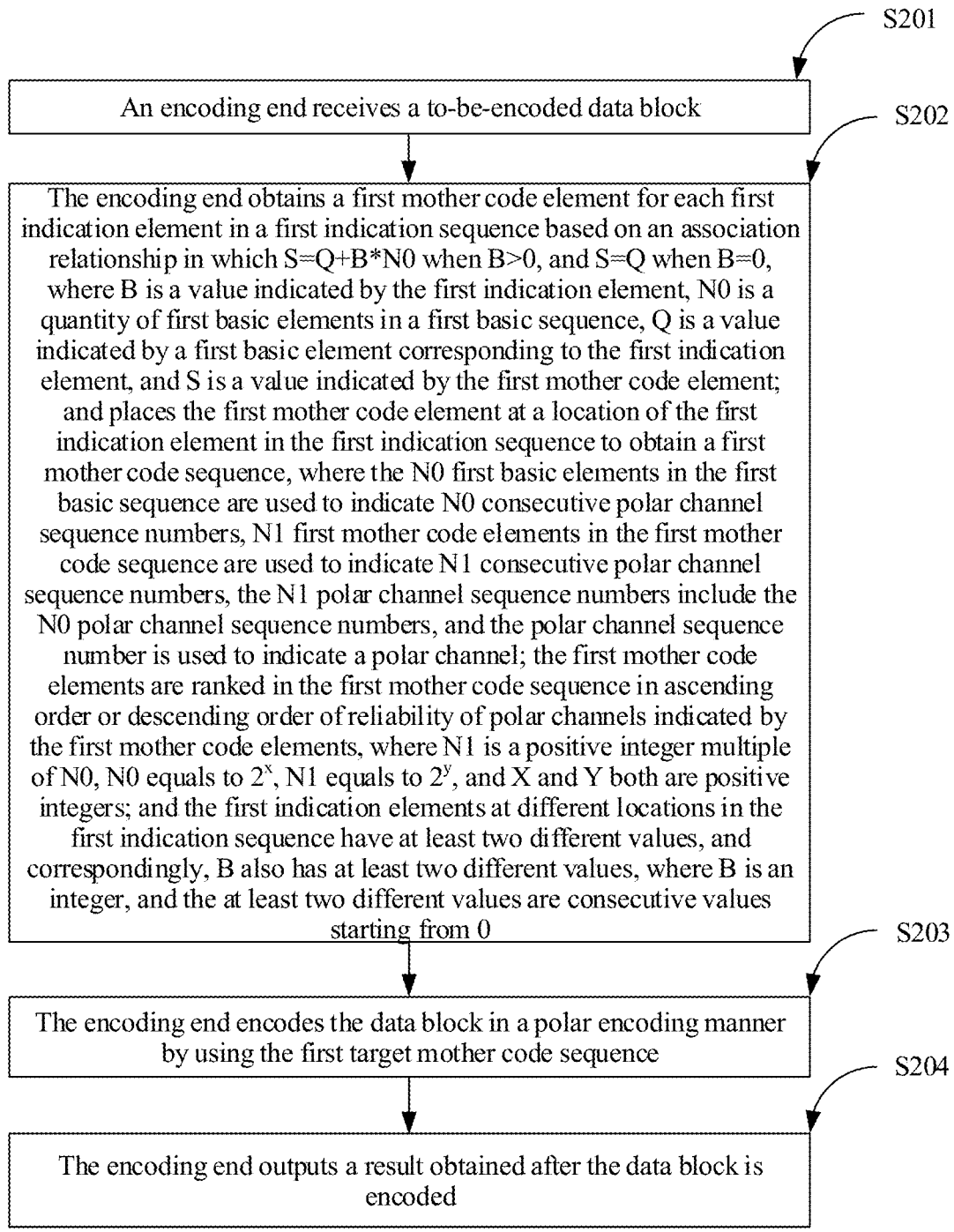
FIG. 3 is a schematic flowchart of a data processing method according to an embodiment of the present invention.

FIG. 3 is a schematic flowchart of a data processing method according to an embodiment of the present invention. The data processing method includes the following operations.

S201. An encoding end receives a to-be-encoded data block.

S202. The encoding end obtains a first mother code element for each first indication element in a first indication sequence based on an association relationship in which S=Q+B*N0 when B>0, and S=Q when B=0, where B is a value indicated by the first indication element, N0 is a quantity of first basic elements in a first basic sequence, Q is a value indicated by a first basic element corresponding to the first indication element, and S is a value indicated by the first mother code element; and places the first mother code element at a location of the first indication element in the first indication sequence to obtain a first mother code sequence, where the N0 first basic elements in the first basic sequence are used to indicate N0 consecutive polar channel sequence numbers, N1 first mother code elements in the first mother code sequence are used to indicate N1 consecutive polar channel sequence numbers, the N1 polar channel sequence numbers include the N0 polar channel sequence numbers, and the polar channel sequence number is used to indicate a polar channel; the first mother code elements are ranked in the first mother code sequence in ascending order or descending order of reliability of polar channels indicated by the first mother code elements, where N1 is a positive integer multiple of N0, N0 equals to $2^x$, N1 equals to $2^y$, and X and Y both are positive integers; and the first indication elements at different locations in the first indication sequence have at least two different values, and correspondingly, B also has at least two different values, where B is an integer, and the at least two different values are consecutive values starting from 0.

S203. The encoding end encodes the data block in a polar encoding manner by using the first mother code sequence.

S204. The encoding end outputs a result obtained after the data block is encoded.

In this embodiment of the data processing method, the first mother code sequence is restored based on a multiple relationship, displayed in the first indication sequence, between each first mother code element in the first mother code sequence and the first basic element in the first basic sequence. In this way, only the first indication sequence and the first basic sequence need to be stored, and the first mother code sequence does not need to be stored. It is easy to understand that a value indicating the multiple relationship is inevitably less than a value in the first mother code sequence, and when the value is small, a quantity of bits used to indicate the value is correspondingly decreased. In this way, a quantity of bits occupied to store the first indication sequence and the first basic sequence is less than a quantity of bits occupied to store the first mother code sequence, thereby reducing storage overheads. How many storage overheads can be reduced is subsequently described in a specific example.

Figure 4:
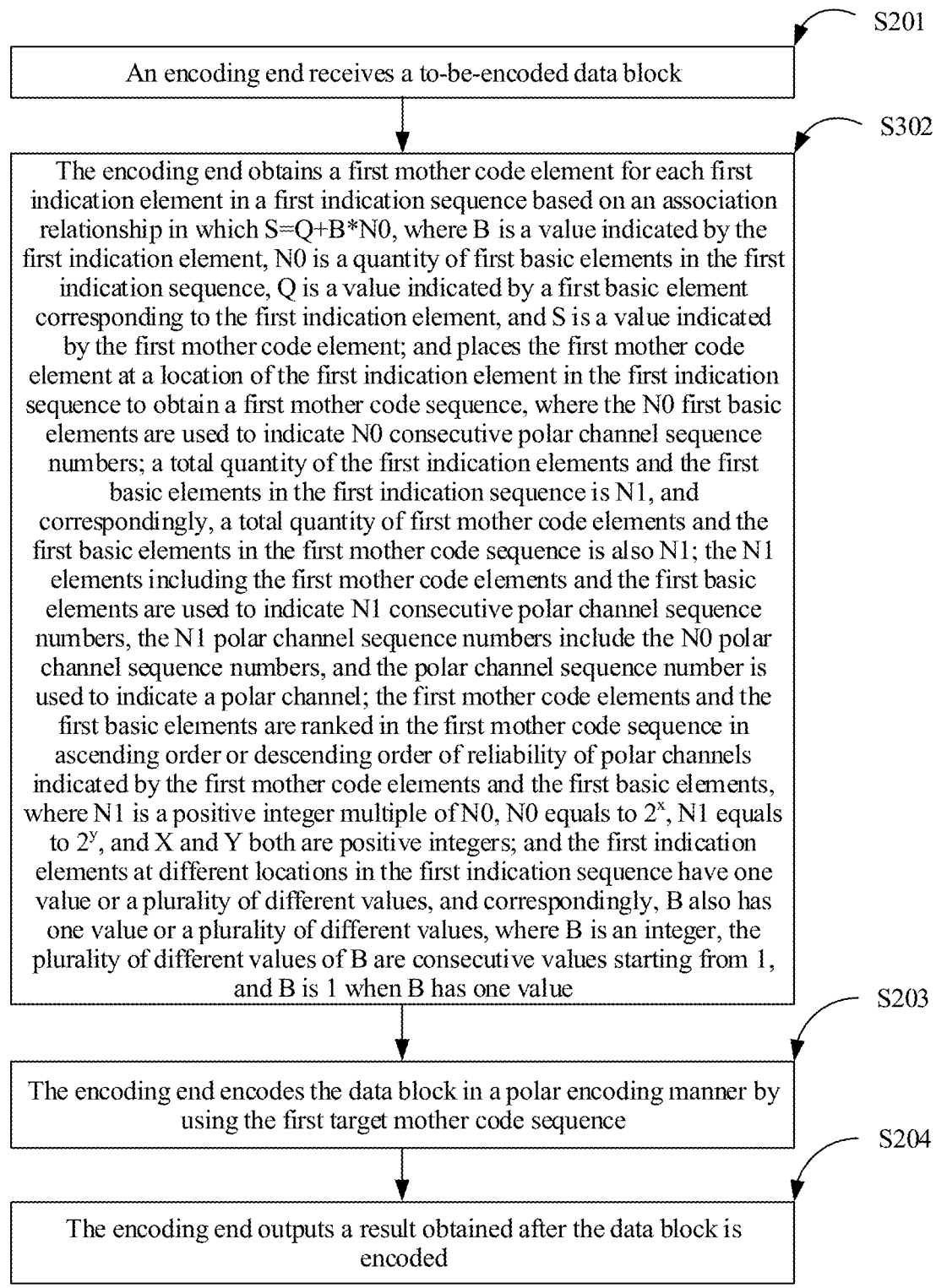
FIG. 4 is a schematic flowchart of another data processing method according to an embodiment of the present invention.

As shown in FIG. 4, in this embodiment of the data processing method, operation S202 may be replaced with the following operation:

S302. The encoding end obtains a first mother code element for each first indication element in a first indication sequence based on an association relationship in which S=Q+B*N0, where B is a value indicated by the first indication element, N0 is a quantity of first basic elements in the first indication sequence, Q is a value indicated by a first basic element corresponding to the first indication element, and S is a value indicated by the first mother code element; and places the first mother code element at a location of the first indication element in the first indication sequence to obtain a first mother code sequence, where the N0 first basic elements are used to indicate N0 consecutive polar channel sequence numbers; a total quantity of the first indication elements and the first basic elements in the first indication sequence is N1, and correspondingly, a total quantity of the first mother code elements and the first basic elements in the first mother code sequence is also N1; the N1 elements including the first mother code elements and the first basic elements are used to indicate N1 consecutive polar channel sequence numbers, the N1 polar channel sequence numbers include the N0 polar channel sequence numbers, and the polar channel sequence number is used to indicate a polar channel; the first mother code elements and the first basic elements are ranked in the first mother code sequence in ascending order or descending order of reliability of polar channels indicated by the first mother code elements and the first basic elements, where N1 is a positive integer multiple of N0, N0 equals to $2^x$, N1 equals to $2^y$, and X and Y both are positive integers; and the first indication elements at different locations in the first indication sequence have one value or a plurality of different values, and correspondingly, B also has one value or a plurality of different values, where B is an integer, the plurality of different values of B are consecutive values starting from 1, and B is 1 when B has one value.

It may be learned from operation S202 and operation S302 in this embodiment of the data processing method that, in addition to storing an offset multiple between a channel sequence number, in the first mother code sequence, other than the first basic sequence and the channel sequence number in the first basic sequence, the first indication sequence may store the channel sequence numbers in the first basic sequence, or store an offset multiple between the channel sequence number in the first basic sequence and the channel sequence number in the first basic sequence. Regardless of a used manner, the N1 elements in the first indication sequence indirectly or directly indicate a reliability order of the N1 polar channels, and each element indicates one polar channel.

In this embodiment of the data processing method, the first mother code sequence is restored based on a multiple relationship, displayed in the first indication sequence, between each first mother code element in the first mother code sequence and the first basic element in the first basic sequence. In this way, only the first indication sequence needs to be stored, and the first mother code sequence does not need to be stored. It is easy to understand that a value indicating the multiple relationship is inevitably less than a value in the first mother code sequence, and when the value is small, a quantity of bits used to indicate the value is correspondingly decreased. In this way, a quantity of bits occupied to store the first indication sequence is less than a quantity of bits occupied to store the first mother code sequence, thereby reducing storage overheads.

In this embodiment of the data processing method, in operation S302, the N1 elements including the first indication elements and the first basic elements in the first indication sequence are in a one-to-one correspondence with the N1 first mother code elements in the first mother code sequence.

When the N1 first mother code elements are ranked in the first mother code sequence in ascending order of reliability of the polar channels indicated by the polar channel sequence numbers indicated by the N1 first mother code elements, correspondingly, the N1 elements including the first indication elements and the first basic elements are ranked in the first indication sequence in ascending order or descending order of reliability of polar channels indicated by polar channel sequence numbers directly or indirectly indicated by the N1 elements including the first indication elements and the first basic elements.

Alternatively, when the N1 first mother code elements are ranked in the first mother code sequence in descending order of reliability of the polar channels indicated by the polar channel sequence numbers indicated by the N1 first mother code elements, correspondingly, the N1 elements including the first indication elements and the first basic elements are ranked in the first indication sequence in ascending order or descending order of reliability of polar channels indicated by polar channel sequence numbers directly or indirectly indicated by the N1 elements including the first indication elements and the first basic elements.

In this embodiment of the data processing method, that the N0 first basic elements are used to indicate N0 consecutive polar channel sequence numbers, and N1 first mother code elements are used to indicate N1 consecutive polar channel sequence numbers means the following:

the N0 first basic elements are used to indicate polar channel sequence numbers from W to W+N0−1, and the N1 first mother code elements are used to indicate polar channel sequence numbers from W to W+N1−1, where W is an integer greater than or equal to 0; or in other words, the polar channel sequence numbers indicated by the N0 first basic elements are integers in [W, W+N0−1], and the polar channel sequence numbers indicated by the N1 first mother code elements are integers in [W, W+N1−1], for example, the N0 first basic elements are used to indicate polar channel sequence numbers from 0 to N0−1, and the N1 first mother code elements are used to indicate polar channel sequence numbers from 0 to N1−1.

Although the polar channel sequence numbers indicated by the N1 first mother code elements in the first mother code sequence are consecutive, the polar channel sequence numbers do not necessarily start from 0, and may start from any integer value. However, storage space is reduced when the polar channel sequence numbers start from 0. Although the polar channel sequence numbers indicated by the N0 first basic elements in the first basic sequence are consecutive, the polar channel sequence numbers do not necessarily start from 0, and may start from any integer value. However, storage space is reduced when the polar channel sequence numbers start from 0. Although polar channel sequence numbers in the offset sequence are consecutive, the polar channel sequence numbers do not necessarily start from 0, and may start from any integer value. However, storage space is reduced when the polar channel sequence numbers start from 0.

In this embodiment of the data processing method, in operation 202, the first indication elements at different locations in the first indication sequence have at least two different values, and correspondingly, B also has at least two different values, where B is an integer, and the at least two different values are consecutive values starting from 0.

In operation 302, the first indication elements at different locations in the first indication sequence have one value or a plurality of different values, and correspondingly, B also has one value or a plurality of different values, where B is an integer, and the plurality of different values of B are consecutive values starting from 1. In one embodiment, B is 1 when B has one value.

In this embodiment of the data processing method, the first indication elements at different locations in the first indication sequence may have different values, to correspondingly indicate that B may have a plurality of different values, so as to express offset multiples between first mother code elements at different locations in the first mother code sequence and corresponding first basic elements. The plurality of different values of B may be some consecutive values starting from 0, or some consecutive values starting from 1.

In this embodiment of the data processing method, that B is a value indicated by the first indication element means that B is equal to the first indication element, or that B is equal to the first indication element plus 1, or that B is equal to the first indication element minus 1. The first indication element may be indicated in a binary, decimal, or hexadecimal manner, and this "1" may also be indicated in a binary, decimal, or hexadecimal manner. B and the first indication element may be directly equal to each other or have an association relationship. Because the first indication element is used to indicate an offset multiple between the first mother code element in the first mother code sequence and the first basic element in the first basic sequence, the first mother code element in the first mother code sequence may be obtained by adding a corresponding first basic element in the first basic sequence and a product of the offset multiple and a length of the first basic sequence. B is the offset multiple. The first indication element is used to identify the offset multiple B. Certainly, that B is equal to the first indication element is a most direct and simple indication manner. However, to adapt to requirements in various occasions, the first indication element may indirectly indicate B. For example, there is a simple conversion relationship between the first indication element and B. In this case, B can be restored based only on the conversion relationship.

In this embodiment of the data processing method, N1 first indication elements in the first indication sequence are in a one-to-one correspondence with the N1 first mother code elements in the first mother code sequence. The first mother code element indicates a polar channel sequence number, and correspondingly, based on the relationship between the first indication element and the first mother code element, it may be considered that the first indication element indirectly indicates a polar channel sequence number.

The N1 first mother code elements are ranked in the first mother code sequence based on reliability of the polar channels indicated by the polar channel sequence numbers indicated by the N1 first mother code elements. The N1 first indication elements are ranked in the first indication sequence based on reliability of polar channels indicated by polar channel sequence numbers indirectly indicated by the N1 first indication elements.

When the N1 first mother code elements are ranked in the first mother code sequence in ascending order of reliability of the polar channels indicated by the polar channel sequence numbers indicated by the N1 first mother code elements, correspondingly, the N1 first indication elements in the first indication sequence are ranked in descending order or ascending order of reliability of the polar channels indicated by the polar channel sequence numbers indirectly indicated by the N1 first indication elements, and the N0 first basic elements are ranked in the first basic sequence in ascending order or descending order of reliability of polar channels indicated by the polar channel sequence numbers indicated by the N0 first basic elements.

Alternatively, when the N1 first mother code elements are ranked in the first mother code sequence in descending order of reliability of the polar channels indicated by the polar channel sequence numbers indicated by the N1 first mother code elements, correspondingly, the N1 first indication elements in the first indication sequence are ranked in descending order or ascending order of reliability of the polar channels indicated by the polar channel sequence numbers indirectly indicated by the N1 first indication elements, and the N0 first basic elements are ranked in the first basic sequence in ascending order or descending order of reliability of polar channels indicated by the polar channel sequence numbers indicated by the N0 first basic elements.

In other words, a ranking rule of the polar channel sequence numbers in the first basic sequence may be the same as or different from a ranking rule of the polar channel sequence numbers indicated in the first mother code sequence. The ranking rule of the polar channel sequence numbers in the first basic sequence may be the same as or different from a ranking rule of the polar channel sequence numbers indirectly indicated by the elements in the first indication sequence.

When channel sequence numbers are extracted from the first basic sequence based on indications of the first indication elements in the first indication sequence, if the ranking rule of the first indication sequence is consistent with that of the first basic sequence, that is, both of the sequences are ranked in descending order of polar channel reliability, or both of the sequences are ranked in ascending order of polar channel reliability, the channel sequence numbers are extracted from the beginning to the end of the first basic sequence; or if the ranking rule of the first indication sequence is reverse to that of the first basic sequence, the channel sequence numbers are extracted from the beginning to the end of the first basic sequence.

In this embodiment of the data processing method, a quantity of first indication elements in the first indication sequence is N1, and correspondingly, a quantity of first mother code elements in the first mother code sequence is also N1.

In this embodiment of the data processing method, N1 is a positive integer multiple of N0. In one embodiment, N1 is an even multiple of N0.

In this embodiment of the data processing method, for each first indication element in the first indication sequence, the first basic sequence has the first basic element corresponding to the first indication element.

In this embodiment of the data processing method, N1 first indication elements form the first indication sequence.

In this embodiment of the data processing method, N0 first basic elements form the first basic sequence.

In this embodiment of the data processing method, N1 first mother code elements form the first mother code sequence.

In this embodiment of the data processing method, the first basic sequence has N0 first basic elements, and it may be considered that N0 indicates a length of the first basic sequence.

In this embodiment of the data processing method, the first indication sequence has N1 first indication elements, and it may be considered that N1 indicates a length of the first indication sequence.

In this embodiment of the data processing method, the first mother code sequence has N1 first mother code elements, and it may be considered that N1 indicates a length of the first mother code sequence.

In this embodiment of the data processing method, the first indication element in the first indication sequence is indicated in a binary, decimal, or hexadecimal manner.

In this embodiment of the data processing method, the first basic element in the first basic sequence is indicated in a binary, decimal, or hexadecimal manner.

In this embodiment of the data processing method, the first mother code element in the first mother code sequence is indicated in a binary, decimal, or hexadecimal manner.

An example is provided below to facilitate understanding of the foregoing embodiment.

First, assuming that N1=16, reliability of 16 polar channels is ranked in ascending order to form a mother code sequence $S_1$.

$S_b = \{0, 1, 2, 4, 8, 3, 5, 6, 9, 10, 12, 7, 11, 13, 14, 15\}$

Sequence numbers less than 4 are successively read from the sequence $S_1$ to obtain a basic sequence S2.

$S_2 = \{0\ 1\ 2\ 3\}$

Sequence numbers in an offset sequence are successively read from the sequence $S_1$ to obtain an offset sequence 1=$\{4\ 5\ 6\ 7\}$. Similarly, an offset sequence 2=$\{8\ 9\ 10\ 11\}$ and an offset sequence 3=$\{12\ 13\ 14\ 15\}$ are obtained.

The basic sequence is $S_2=\{0\ 1\ 2\ 3\}$, and sequence numbers 4 to 15 are divided into three offset sequences. Sequence numbers 4 to 7 belong to the offset sequence 1, sequence numbers 8 to 11 belong to the offset sequence 2, and sequence numbers 12 to 15 belong to the offset sequence 3.

In one embodiment, the remaining polar channel sequence numbers other than the sequence numbers in the basic sequence are divided into three offset sequences. Each offset sequence includes four sequence numbers, and the four sequence numbers in each offset sequence are in a one-to-one correspondence with the four sequence numbers in the basic sequence.

There is a same offset difference (or offset multiple) between sequence numbers belonging to a same offset sequence and sequence numbers at corresponding locations in the basic sequence. For example, an offset difference between the sequence number in the offset sequence 1 and the sequence number in the basic sequence is 4 (an offset multiple is 1), an offset difference between the sequence number in the offset sequence 2 and the sequence number in the basic sequence is 8 (an offset multiple is 2), and an offset difference between the sequence number in the offset sequence 3 and the sequence number in the basic sequence is 12 (an offset multiple is 3).

It may be learned from operation S202 and operation S302 in the embodiment of the data processing method that the indication sequence may be constructed in two construction manners. In a first manner of constructing the indication sequence, the basic sequence is directly stored in the indication sequence. To be specific, when a channel sequence number belongs to the basic sequence, the channel sequence number does not need to be changed and is directly the same as that stored in the mother code sequence. In a second manner of constructing the indication sequence, when a sequence number belongs to the basic sequence, an offset multiple between the sequence number and a corresponding sequence number in the basic sequence is stored in the indication sequence, for example, the offset multiple is stored as 0.

As shown in FIG. 5, when the first manner of constructing the indication sequence is used, in the indication sequence, 2 bits are used to indicate each sequence number in the mother code sequence. The sequence number in the basic sequence is directly stored at a sequence number location in the basic sequence, and an offset multiple between the sequence number in the mother code sequence and the sequence number in the basic sequence is stored at a sequence number location in the offset sequence.

When a stored polar channel sequence number belongs to the basic sequence, the polar channel sequence number is stored, and the polar channel sequence number is indicated by using 2 bits. For example, 00, 01, 10, and 11 are used to respectively indicate polar channel sequence numbers 0, 1, 2, and 3.

When a stored polar channel sequence number belongs to the offset sequence, an offset multiple between a polar channel sequence number at a current location and a polar channel sequence number at a corresponding location in the basic sequence is stored. For example, a polar channel whose sequence number is 5 is stored by using "00", to display an offset multiple 1 between the sequence number 5 and the sequence number in the basic sequence. For another example, a polar channel whose sequence number is 9 is stored by using "01", to display an offset multiple 2 between the sequence number 9 and the sequence number in the basic sequence.

FIG. 6 is a schematic diagram of directly storing the mother code sequence according to an embodiment of the present invention. As shown in FIG. 6, that N=16 is used as an example. If the mother code sequence is directly stored, each polar channel sequence number needs to be indicated by using 4 bits. Sequence numbers 0 to 15 are respectively indicated by using "0000" to "1111".

FIG. 7 is a schematic diagram of an indication sequence constructed when another basic sequence is selected. The basic sequence is selected as {0 1 2, . . . 7}, and each of offset differences between the remaining polar channel sequence numbers and the sequence numbers in the basic sequence is 8, that is, each of offset multiples is 1. In this case, a maximum sequence length of the basic sequence is 8. Therefore, 3 bits need to be used to indicate the sequence number in the basic sequence. Because the offset multiple between the remaining polar channel sequence number and the sequence number in the basic sequence is 1, only 1 bit needs to be used to indicate the offset multiple. In order that a quantity of bits used to indicate the offset multiple is consistent with a quantity of bits used for the basic sequence to indicate the sequence number, 3 bits are also used when each of offset multiples of sequence numbers 8 to 15 is stored. In this way, each sequence number in the indication sequence can be indicated by using 3 bits.

It may be learned from the foregoing example that when a mother code sequence is stored, if an indication sequence is used to express the mother code sequence, regardless of whether 3 bits or 2 bits are used to indicate each polar channel sequence number in the mother code sequence, a quantity of bits occupied when each sequence number needs to be indicated by using 4 bits to directly store the mother code sequence can be decreased.

Table 1 shows a result of comparison between storage space occupied to store a mother code sequence and storage space occupied to store an indication sequence.

TABLE 1

| Target mother code length sequence (N) | Direct storage | Storage with an indication sequence | | |
|---|---|---|---|---|
| | Quantity of bits occupied by each sequence number | Quantity of bits occupied by each sequence number | Basic sequence range | Reduced space |
| 256 | 8 | 5 | 0 to 15 | 37.5% |
| 512 | 9 | 6 | 0 to 31 | 33.3% |
| 1024 | 10 | 6 | 0 to 31 | 40% |
| 2048 | 11 | 7 | 0 to 63 | 36.4% |
| 4096 | 12 | 7 | 0 to 63 | 41.7% |
| 8192 | 13 | 8 | 0 to 127 | 38.5% |
| 16384 | 14 | 8 | 0 to 127 | 42.9% |
| 32768 | 15 | 9 | 0 to 255 | 40% |
| 65536 | 16 | 9 | 0 to 255 | 43.75% |
| 131072 | 17 | 10 | 0 to 511 | 41.2% |
| 262144 | 18 | 10 | 0 to 511 | 44.4% |
| 524288 | 19 | 11 | 0 to 1023 | 42.1% |
| 1048576 | 20 | 11 | 0 to 1023 | 45% |

It may be learned from Table 1 that when the mother code sequence is stored, compared with a manner of directly storing the mother code sequence, storage space may be reduced by about 40% in a manner of storing the mother code sequence by using the indication sequence.

Figure 8:
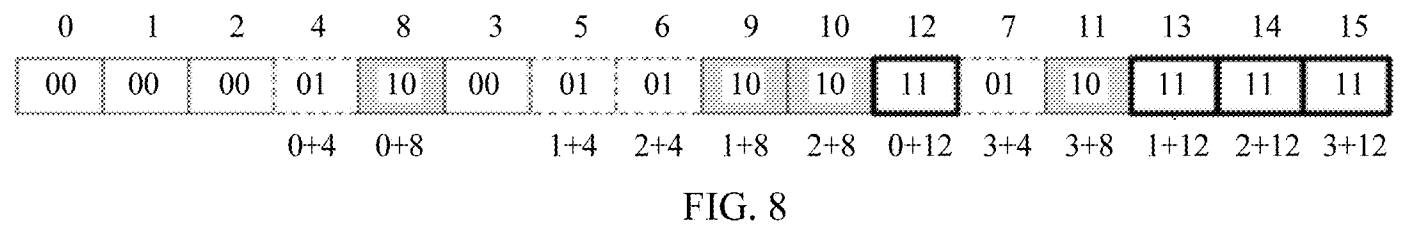

As shown in FIG. 8, when the second implementation of constructing the indication sequence is used, in the indication sequence, 2 bits are used to indicate each sequence number in the mother code sequence, and the 2 bits are used to indicate an offset multiple between each sequence number in the mother code sequence and a corresponding sequence number in the basic sequence.

When a stored polar channel sequence number belongs to the basic sequence, an offset multiple between the polar channel sequence number and a corresponding sequence number in the basic sequence is stored, and the offset multiple is indicated by using 2 bits. For example, 00, 00, 00, and 00 are used to respectively indicate that offset multiples between sequence numbers in the mother code sequence and polar channel sequence numbers 0, 1, 2, and 3 in the basic sequence are respectively 0, 0, 0, and 0.

When a stored polar channel sequence number belongs to the offset sequence, an offset multiple between a polar channel sequence number at a current location and a polar channel sequence number at a corresponding location in the basic sequence is stored. For example, a polar channel whose sequence number is 5 is stored by using "01", to display an offset multiple 1 between the sequence number 5 and the sequence number in the basic sequence. For another example, a polar channel whose sequence number is 9 is stored by using "10", to display an offset multiple 2 between the sequence number 9 and the sequence number in the basic sequence.

FIG. 9 shows an implementation in which another basic sequence is used and a second manner of constructing the indication sequence is used. The basic sequence is selected as {0 1 2, . . . 7}, and each of offset differences between the remaining polar channel sequence numbers and the sequence numbers in the basic sequence is 8, that is, each of offset multiples is 1. In this case, an offset multiple between the sequence number in the basic sequence and a corresponding sequence number in the basic sequence is 0, and the offset multiple between the remaining polar channel sequence number and the sequence number in the basic sequence is 1. Therefore, only 1 bit needs to be used to indicate the sequence number. In this way, each sequence number in the indication sequence can be indicated by using 1 bit.

It should be noted that when the second implementation of constructing the indication sequence is used, a basic sequence needs to be stored, but a quantity of bits occupied to store the indication sequence may be decreased as shown in the example in shown FIG. 9. In this way, in summary, storage space can still be greatly reduced compared with storing the mother code sequence.

It may be learned from the descriptions in the foregoing embodiment that a longer sequence may be extended from a basic sequence level-by-level based on a relationship between an indication sequence and the basic sequence. For example, a length of the basic sequence is 16, and a length of a required mother code sequence is 128. In this case, a mother code sequence with a length of 32 needs to be restored from the basic sequence based on an indication sequence 16→32, then a mother code sequence with a length of 64 needs to be restored from the sequence with the length of 32 based on an indication sequence 32→64, and finally the mother code sequence with the length of 128 is restored from the sequence with the length of 64 based on an indication sequence 64→128.

Several examples of basic sequences and indication sequences are provided below. That N0=16 indicates a basic sequence with a length of 16, and 16→32 indicates an indication sequence used to restore a mother code sequence with a length of 32 from the basic sequence with the length of 16. Another case is similar to this.

Basic sequence (indicated in a decimal manner):
N0=16: [0 1 2 4 8 3 5 6 9 10 12 7 11 13 14 15]
N0=32: [0 1 2 4 8 16 3 5 6 9 10 17 12 18 20 7 24 11 13 19 14 21 22 25 26 28 15 23 27 29 30 31]
N0=64: [0 1 2 4 8 16 3 32 5 6 9 10 17 12 18 33 20 34 7 24 36 11 40 13 19 14 48 21 35 22 25 37 26 38 41 28 42 15 49 44 50 23 52 27 39 56 29 43 30 45 51 46 53 54 57 58 31 60 47 55 59 61 62 63]

Indication sequence (indicated in a hexadecimal manner):
16→32: 0x041697DF
32→64: 0x01014A296BAD7F7F
64→128: 0x001002888498A553355AE6DEEEBFF7FF
128→256:
0x00008001110408461251243193454D34D34D5D3673DB75B79DEFDF777FFEFFFF
256→512:
0x000000400004204080210140900C1120640C22C0A914C87413283C8B8C5741B296B27 D15CE2EC3EB37D1ECD76AFCBBCFD9FB77CF6FD7F7BFEFDFBDFFFFDFFFFFF
512→1024:
0x000000000008000000820200100101 00A0202088210403402808884184825034 11A0431 08A8A418C81B211A0C2C44B5150E39075308D9285918DA95938E87ACC4DCCA1E8 E3656A4E765EB64EF351F638F5752DDCBCFA77B27ECE7DAEAEF73DFA77D3F5BE DE7DEEEFEBFD3FDF7BEEFBFBFAFF7F7FF7FFBFBEFFFFFFEFFFFFFFFF
1024→2048:
0x0000000000000000400000000080400400200001 00400900044002800840100184 01102 00920015200212014204304082508801531002990028 5220A0814312110A2923100B4710 052B5081428A82890945892462A2991C40369728414B652814929D0A8909AAC4991C A8B64B942369B94A0A6DAAD0A9253D2A8924EEB13647551D937288DB6EAB435B 6AF4AA49AFAD62693BD62D92EAC7 66DCAA6F6EAF46B6D7EB592D7DEB1693FD C766BAB9DB6E5D6F6EBEAEBD7EF52B5FF71D2FF73B6BAF77B73D7EFAFBB5EB FF66BFF7357FEEF5BEFDF3DFBD7FB7BFFB57FFB6FFBF77FDE7FF7FDEFFEBFFD DFFF6FFDFF7FFFFBFFDFFDFEFFFFFFFFFDFFFFFFFFFFFFFFFFF Examples of a basic sequence and an indication sequence are provided below. A shorter sequence is the basic sequence, and a longer sequence is the indication sequence. A length of the basic sequence is 16. A mother code sequence with a length of 256 may be restored based on the indication sequence, and the length of the basic sequence is increased by 16 times.

N0=16, and N1=256:
[0 1 2 4 8 3 5 6 9 10 12 7 11 13 14 15]
0x0000010200040101821201240420140831482118251248216420934248314A 83514825831C6852196482593624A9364A835934AC78531C6A58359C6825B96C65A93 964AD7936AC7A593ECA7835BC6AC75B9C65BD9C6AD7B96EDA793EC7AD7BEAC 75BEC7BDBC6FDB9ED7BDEAD7EED7BEC7FBEFDBFBDEFDED7EFEFBFFFDFEF FFFF Examples of a basic sequence and an indication sequence are provided below. A shorter sequence is the basic sequence, and a longer sequence is the indication sequence. A length of the basic sequence is 32. A mother code sequence with a length of 512 may be restored based on the indication sequence, and the length of the basic sequence is increased by 16 times.

N0=32, and N1=512:
[0 1 2 4 8 16 3 5 6 9 10 17 12 18 20 7 24 11 13 19 14 21 22 25 26 28 15 23 27 29 30 31]
0x0000000100020000410100120821002041024100 4120182410832104182124 108254120241824108 634210493824124183182541A83254182418258634210C96385241 24986341825493A8632541A4938258634A1835C96385241AC97865341825C963A58632 549AC9638256B4A98635C9635A493AC97865341AD7C963A5863A5C97A5C963825E BCA978635C6B5AC963AC9765B49AD7C96356BADC97A5C963AD7EBCA978635EB DA7C963AC7E5BC97AD7C6B5EBADC975C6BAD7EBC976BDEBDA7C963FEDBC9 7AD7EBD7EBADC75EBAD7EC7EBDEBD7C6BFEDBC97FEBD7EBDFDEBAD7FEB DED7FBEFDC7FEBD7EFDEBFFEBDFEBFDFFED7FDEFFEFEBFFFFDFFFEFFFFFF F Examples of a basic sequence and an indication sequence are provided below. A shorter sequence is the basic sequence, and a longer sequence is the indication sequence. A length of the basic sequence is 64. A mother code sequence with a length of 1024 may be restored based on the indication sequence, and the length of the basic sequence is increased by 16 times.

N0=64, and N1=1024:
[0 1 2 4 8 16 3 32 5 6 9 10 17 12 18 33 20 34 7 24 36 11 40 13 19 14 48 21 35 22 25 37 26 38 41 28 42 15 49 44 50 23 52 27 39 56 29 43 30 45 51 46 53 54 57 58 31 60 47 55 59 61 62 63]
0x00000000000100002000000104100010200120008201004120041100204101 200412820101820412008 43121002414182012041041282054112820412041828 43121008 6431421820124943182041282415843112820524141A828431250418286431421820 58643 94321820412C96431852843112824958643141A828352549431A82864312582415A86439 4321820586C39643A1852843152C964398528643141A82C975865439431A82863525C9 6431A5A8643932582495A86C39643A18283556CB9643A9852864315AC96C3975A865 439431A82C975865C396431A5A863D725C96439A5A86C3963A582C975A56CB 9643A 98286355ECB96C3A975A8643935AC6CB975A8-65C396431AAC97D765CB96439A5A8 63D7A5C96C-3975A56CB963AD82C975A5ECB96C3A97A863D75E-CB6CBA975A86C 39635AECB97DA765CB96439AA-C7D7E5CB96C3975A6BD7ADC6CB975A5ECB963 AD-AC97D75ECB6CBA97A863D75EBECB97DA76CB963-DAECB7DA7E5CB96C397A FD7EDCB6CB975A-EBD7ADECB97D75ECB6BADAC7D75EBECB97A6B-D7DEECB7 DA7ECB963DEBFD7EDCB6CB97AF-D7EDBECB97D7EBFADECB7D75EBEBDAFD7 DEEC-B7AEBD7DEBFD7ECB6BDEFD7EDBECB97FFEDEC-B7D7EBFDEBFD7DEEB AFD7DEBFEBFDEFD7EB-EBDFFEDECB7FFDEBFD7EFEFD7DEBFFDEFEBFD-FFEE BFFDEBFFEFD7FFFDEFFDFEFFFEBFEFFFF-FFDFFFFEFFFFFFFFFF Examples of a basic sequence and an indication sequence are provided below. A shorter sequence is the basic sequence, and a longer sequence is the indication sequence. A length of the basic sequence is 128. A mother code sequence with a length of 2048 may be restored based on the indication sequence, and the length of the basic sequence is increased by 16 times.

N0=128, and N1=2048:

[0 1 2 4 8 16 3 32 5 6 9 64 10 17 12 18 33 20 34 7 24 36 65 11 66 40 13 19 68 14 48 21 72 35 22 25 37 80 26 38 67 41 28 96 69 42 15 49 70 44 73 50 23 74 52 81 27 76 39 82 56 29 97 84 43 30 98 71 45 88 51 100 46 75 53 104 77 54 83 57 78 112 85 58 31 99 86 60 89 101 47 90 102 105 92 55 106 79 113 59 108 114 87 61 116 62 91 103 120 93 107 94 109 115 110 117 63 118 121 122 95 124 111 119 123 125 126 127]

0x000000000000000010000000020000001000100041-00002010020000102000 10082014100004102010042-101000120204100102080201410282001410201082014-2101 000843210210410012421041802014120284210014102812802054142101208204814321021041082-8432142110418020186432104218421001412429843218-0205414128122842105 48143210124812802854321-4211041A0828438614321504218421082186432144291-84321 802054186432984322184210548143121C1296843-21805285432141124812842985438614329584321 43215041A4-81288238654321544291843214A08258643861432958432-218421054A186432 9C432961843218052854318-6C31296843A21845298543861431524C1A9684329885-2386 5432154491A4381A28C297865438615432958-4321A4812586A386543295C43296184321 A05A58-643869C332965843A21845298543A186C35296C43A96-18432988523865431564 CB1A96843A298C5297865-4386154395A43C1A968C3297865A3865543295C43961-A43 81A25CA97865438695C33296584321A459A586A-386DC372965C43A96184329A853A5 86C35696C-B3A965843A298C529786543A156CB5A96C43A9698C-3297865A386554395 E43CB1A968C3A297C5A9-7865438695C33965A43C1A65CBA97865A386D5C372-965C 43961A439AA5CA9786DC376965CB3A965843-29AC597A586A356DCB7A965C43A96 98C32978653-A556CB5E96CB3A96D8C3A297C5A9786543A95E3C-B5A96CC3A697CB A97865A386D5C37965E43C-B1A6CBAA97C5A9786DC376965CB3965A439AE5C-BA9 786DA376D5CB7A965C43969AC397A5CA756D-CB7E965CB3A96D8C3297C597A56A B5EDCB7A9-6DCC3A697CBA978653AD5E7CB5E96CB3A6DCBA-A97C5A9786DC379 65E3CB5A6CBAE97CBA97-86DA376D5CB7965E43B9AECBA97CDA776DCB7E9-65C B396DAC397E5CBA76DAB7ED5CB7A96DCC-3697CB97A5AF5EDCB7E96DCB3A6D CBA97C597A-DE7B5EDCB7A6DCBAE97CBA9786D37D5E7CB5E6-BBAEDCBA97CD A776DCB7965E3BDAECBE97-CBA76DAB7ED5CB796DEC397ECBA7DAF7EDCB7E 96DCB36DCB97E5BAFEDB7EDDCB7A6DCBE97CB-97AD7F5EDCB7E6DBBAEDCB A97CD77DE7B-5EBFAEDCBE97CBA76DB7D5E7BDEEBEDCBA7DA-F7EDCB796DE3DECBE7BAFEDB7EDDCB76DCB97-EBAFDF7EDCB7E6DBBEDCB97ED7FEDB7ED BF-AEDCBE97CB7D7F5EBFEEDBEDCBA7DF7DE7BDE-FEDCBE7BAFEDB7DDE7D EBEBAFDF7EDC-B76DBDEBEFFEDB7EDBFEDCB97EFDF7EBFEEDB-EDCB7D7FEB FEDFEDCBE7BFD7FDEFEDBEB-AFDF7DE7DFEBEFFEDB7DFDEBEFDF7EBFEDB DE-FFEBFEDFEDCB7FFFEFEDBEBFD7FEFDFEBEFFD7-DFEBEFDF7FDFEFFEBFDF DEFFFEFEDBFFEFDFE-BFFFFEBEFD7FFEFFFDFEFFFFDFFEFDFFFFEBFFF-EFFFEF FFFFFDFFFFFFFFEFFFFFFFFFFFFFFFF

In this embodiment of the data processing method, before operation S202, the method further includes the following:

The encoding end extracts, from a second indication sequence, each second indication element indicating a value less than a maximum value of B and each second indication element indicating a value equal to the maximum value of B; and ranks the second indication elements in an order in which the second indication elements are ranked in the second indication sequence, to form the first indication sequence, where the second indication element indicating the value less than the maximum value of B and the second indication element indicating the value equal to the maximum value of B both are used as the first indication elements in the first indication sequence, and in addition to the second indication element indicating the value less than the maximum value of B and the second indication element indicating the value equal to the maximum value of B, the second indication sequence includes a second indication element indicating a value greater than the maximum value of B.

A length of the second indication sequence is greater than that of the first indication sequence. The longer second indication sequence may be generated based on a longer mother code sequence, and then the shorter first indication sequence is generated based on the longer second indication sequence.

Figure 10:
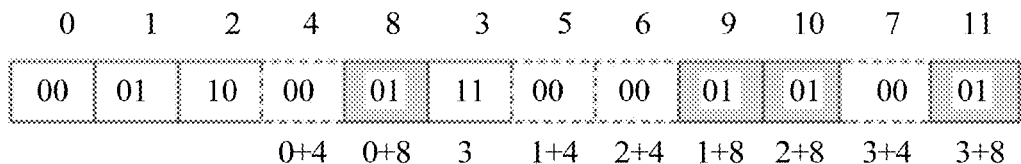
FIG. 10 is a schematic diagram of an indication sequence formed after an indication element indicating an offset multiple greater than 2 is deleted from the indication sequence shown in FIG. 5 according to an embodiment of the present invention.

For example, after an indication element indicating an offset multiple greater than 2 is deleted from FIG. 5, an indication sequence in FIG. 10 is formed. In this way, a shorter mother code sequence may be restored based on a shorter indication sequence.

In this embodiment of the data processing method, before operation S202, the method further includes the following:

The encoding end extracts, from a second basic sequence, each second basic element indicating a value less than F and each second basic element indicating a value equal to F; and ranks the second basic elements in an order in which the second basic elements are ranked in the second basic sequence, to form the first basic sequence, where the second basic element indicating the value less than F and the second basic element indicating the value equal to F both are used as the first basic elements in the first basic sequence, and in addition to the second basic element indicating the value less than F and the second basic element indicating the value equal to F, the second basic sequence includes a second basic element indicating a value greater than F, where F is a positive integer.

A length of the second basic sequence is greater than a length of the first basic sequence.

Figure 11:
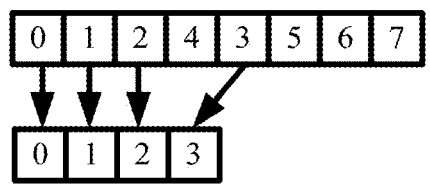
FIG. 11 is a schematic diagram of generating a shorter basic sequence according to a longer basic sequence according to an embodiment of the present invention.

As shown in FIG. 11, the shorter first basic sequence may be generated based on the longer second basic sequence.

In this embodiment of the data processing method, before operation S202, the method further includes the following:

The encoding end obtains the first basic element for each third indication element in a third indication sequence based on an association relationship in which $S1=Q1+B1*N3$ when $B1>0$, and $S1=Q1$ when $B1=0$, where B1 is a value indicated by the third indication element, N3 is a quantity of third basic elements in a third basic sequence, Q1 is a value indicated by a third basic element corresponding to the third indication element, S1 is a value indicated by the first basic element; and places the first basic element at a location of the third indication element in the third indication sequence to obtain the first basic sequence, where the N3 third basic elements are used to indicate consecutive N3 polar channel sequence numbers, the N0 first basic elements are used to indicate N0 consecutive polar channel sequence numbers, the N0 polar channel sequence numbers include the N3 polar channel sequence numbers, and the polar channel sequence number is used to indicate a polar channel; the first basic elements are ranked in the first basic sequence in ascending order or descending order of reliability of polar channels indicated by the first basic elements; a quantity of third indication elements in the third indication sequence is N0, and correspondingly, the quantity of first basic elements in the first basic sequence is also N0, where N0 is a positive integer multiple of N3, N3 is $2^P$, and P is a positive integer; and the third indication elements at different locations in the third indication sequence have at least two different values, and correspondingly, B1 also has at least two different values, where B1 is an integer, and the at least two different values are consecutive values starting from 0.

In this embodiment of the data processing method, before operation S202, the method may further include the following:

The encoding end obtains the first basic element for each third indication element in a third indication sequence based on an association relationship in which $S1=Q1+B1*N3$, where B1 is a value indicated by the third indication element, N3 is a quantity of third basic elements in the third indication sequence, Q1 is a value indicated by a third basic element corresponding to the third indication element, S1 is a value indicated by the first basic element; and places the first basic element at a location of the third indication element in the third indication sequence to obtain the first basic sequence, where a total quantity of the third basic elements and the third indication elements in the third indication sequence is N0, the third basic element in the third indication sequence is correspondingly used as the first basic element, and correspondingly, the quantity of first basic elements in the first basic sequence is also N0; the N3 third basic elements are used to indicate consecutive N3 polar channel sequence numbers, the N0 first basic elements in the first basic sequence are used to indicate N0 consecutive polar channel sequence numbers, the N0 polar channel sequence numbers include the N3 polar channel sequence numbers, and the polar channel sequence number is used to indicate a polar channel; the first basic elements are ranked in the first basic sequence in ascending order or descending order of reliability of polar channels indicated by the first basic elements, where N0 is a positive integer multiple of N3, N3 is $2^P$, and P is a positive integer; and the third indication elements at different locations in the third indication sequence have one value or a plurality of different values, and correspondingly, B1 also has one value or a plurality of different values, where B1 is an integer, the plurality of different values of B1 are consecutive values starting from 1, and B1 is 1 when B1 has one value.

The third basic sequence may be extended to the first basic sequence based on the third indication sequence. An extension manner is the same as an extension manner of extending the first basic sequence to the first mother code sequence based on the first indication sequence, and reference may be made to embodiments of the extension manner of extending the first basic sequence to the first mother code sequence based on the first indication sequence.

In one encoding process, a same basic sequence may be extended to different lengths based on a plurality of indication sequences with different lengths, and an extended sequence may also be further extended a plurality of times based on a plurality of indication sequences with different lengths. For example, the first basic sequence whose length is two times a length of the third basic sequence is obtained based on the third indication sequence and the third basic sequence, and then the first basic sequence is extended based on the first indication sequence to the first mother code sequence whose length is four times the length of the first basic sequence.

A plurality of indication sequences may be stored, and maximum values of indication elements in the indication sequences are different. In this way, a mother code sequence may be extended by a plurality of different times. Examples in which a plurality of extensions are performed are provided below.

In a first example, a basic sequence with a length of 16 is extended to a sequence with a length of 32 based on an indication sequence with a length of 32, then the sequence with the length of 32 is extended to a sequence with a length of 64 based on an indication sequence with a length of 64, and next, the sequence with the length of 64 is extended to a sequence with a length of 1024 based on an indication sequence with a length of 1024.

16→32 indicates an indication sequence used to extend a sequence with a length of 16 to a sequence with a length of 32, and another case is similar to this.

Basic Sequence
N0=16: [0 1 2 4 8 3 5 6 9 10 12 7 11 13 14 15]
Indication Sequence for Level-by-Level Extension
16→32: 0x041697DF
32→64: 0x01014A296BAD7F7F
Sequence for Multi-Level Extension
64→1024:
0x000000000001000020000010410001020012000820-
010041200411002041012004128201018204120084312-
10024141820120410412820541128204120418284312-
008 6431421820124943182041282415843112820524141-
1A82843125041828643142182058643 9432182041-
2C96431852843112824958643141A828352549431A82-
864312582415A86439 4321820586C39643A1852843-
152C964398528643141A82C975865439431A82863525C9
6431A5A8643932582495A86C39643A18283556CB964-
3A9852864315AC96C3975A865 439431A82C975865-
C396431A5A863D725C96439A5A86C3963A582C975A-
56CB9643A 98286355ECB96C3A975A8643935AC6CB-
975A865C396431AAC97D765CB96439A5A8 63D7A5-
C96C3975A56CB963AD82C975A5ECB96C3A97A863-
D75ECB6CBA975A86C 39635AECB97DA765CB964-
39AAC7D7E5CB96C3975A6BD7ADC6CB975A5ECB-
963 ADAC97D75ECB6CBA97A863D75EBECB97DA-
76CB963DAECB7DA7E5CB96C397A FD7EDCB6C-
B975AEBD7ADECB97D75ECB6BADAC7D75EBECB9-
7A6BD7DEECB7 DA7ECB963DEBFD7EDCB6CB97A-
FD7EDBECB97D7EBFADECB7D75EBEBDAFD7 DEE-
CB7AEBD7DEBFD7ECB6BDEFD7EDBECB97FFEDE-
CB7D7EBFDEBFD7DEEB AFD7DEBFEBFDEFD7EBE- BDFFEDECB7FFDEBFD7EFEFD7DEBFFDEFEBFDF-
FEE BFFDEBFFEFD7FFFDEFFDFEFFFEBFEFFFFFF-
DFFFFEFFFFFFFFFFFF In a second example, a basic sequence with a length of 16 is extended to a sequence with a length of 256 based on an indication sequence with a length of 256, the sequence with the length of 256 is then extended to a sequence with a length of 512 based on an indication sequence with a length of 512, the sequence with the length of 512 is next extended to a sequence with a length of 1024 based on an indication sequence with a length of 1024, and the sequence with the length of 1024 is further extended to a sequence with a length of 2048 based on an indication sequence with a length of 2048.

16→256 indicates an indication sequence used to extend a sequence with a length of 16 to a sequence with a length of 256, and another case is similar to this.

Basic Sequence

N0=16: [0 1 2 4 8 3 5 6 9 10 12 7 11 13 14 15]

Sequence for Multi-Level Extension

16→256:
0x0000010200040101821201240420140831482118 25-
1248216420934248314A 83514825831C68521964825-
93624A9364A835934AC78531C6A58359C6825B96C65-
A93 964AD7936AC7A593ECA7835BC6AC75B9C65B-
D9C6AD7B96EDA793EC7AD7BEAC 75BEC7BDBC6-
FDB9ED7BDEAD7EED7BEC7FBEFDBFBDEFDED7E-
FEFBFFFDFEF FFFF

Sequence for Level-by-Level Extension

256→512:
0x0000004000042040802101409 0C1120640C22C0A91-
4C87413283C8B8C5741B296B27 D15CE2EC3EB3-
7D1ECD76AFCBBCFD9FB77CF6FD7F7BFEFDFBDF-
FFFDFFFFFF

512→1024:
0x000000000008000000820200100101 00A02020882104-
0340280888418482503411A0431 08A8A418C81B211-
A0C2C44B5150E39075308D9285918DA95938E87AC-
C4DCCA1E8 E3656A4E765EB64EF351F638F5752D-
DCBCFA77B27ECE7DAEAEF73DFA77D3F5BE DE7-
DEEEFEBFD3FDF7BEEFBFBFAFF7F7FF7FFBFBE-
FFFFFFEFFFFFFFFFFFFF

1024→2048:
0x00000000000000004000000000804004002000010040-
09000440028008401001840110 2 0092001520021-
20142043040825088015310029900285220A081431211-
0A2923100B4710 052B5081428A82890945892462A29-
91C40369728414B652814929D0A8909AAC4991C A8-
B64B942369B94A0A6DAAD0A9253D2A8924EEB136-
47551D937288DB6EAB435B 6AF4AA49AFAD6-
2693BD62D92EAC766DCAA6F6EAF46B6D7EB592D-
7DEB1693FD C766BAB9DB6E5D6F6EBEAEBD7E-
F52B5FF71D2FF73B6BAF77B73D7EFAFBB5EB FF6-
6BFF7357FEEF5BEFDF3DFBD7FB7BFFB57FFB6FFB-
F77FDE7FF7FDEFFEBFFD DFFF6FFDFF7FFFFBFFDF-
FDFEFFFFFFFFFDFFFFFFFFFFFFFFFFF

In this embodiment of the data processing method, the polar encoding manner is a PC-polar encoding manner or a CA-polar encoding manner. In one embodiment, the CA-polar encoding manner may be any CA-polar encoding manner specified in the 3GPP (3rd Generation Partnership Project) standard. The PC-polar encoding manner may be any PC-polar encoding manner specified in the 3GPP standard.

The encoding end in this embodiment of the data processing method may be any wireless communications device with a wireless communication function, for example, an access point, a station, user equipment, or a base station.

Figure 12:
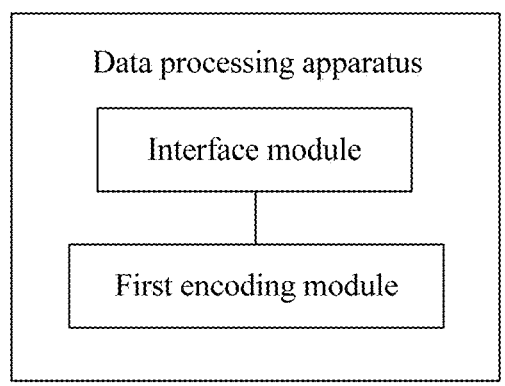
FIG. 12 is a schematic structural diagram of a data processing apparatus according to an embodiment of the present invention.

FIG. 12 is a schematic structural diagram of a data processing apparatus according to an embodiment of the present invention, and the data processing apparatus includes:

an interface module, configured to receive a to-be-encoded data block; and a first encoding module, configured to obtain a first mother code element for each first indication element in a first indication sequence based on an association relationship in which, $S=Q+B*N0$ when $B>0$, and $S=Q$ when $B=0$, where B is a value indicated by the first indication element, N0 is a quantity of first basic elements in a first basic sequence, Q is a value indicated by a first basic element corresponding to the first indication element, and S is a value indicated by the first mother code element; and place the first mother code element at a location of the first indication element in the first indication sequence to obtain a first mother code sequence, where the N0 first basic elements in the first basic sequence are used to indicate N0 consecutive polar channel sequence numbers, N1 first mother code elements in the first mother code sequence are used to indicate N1 consecutive polar channel sequence numbers, the N1 polar channel sequence numbers include the N0 polar channel sequence numbers, and the polar channel sequence number is used to indicate a polar channel; the first mother code elements are ranked in the first mother code sequence in ascending order or descending order of reliability of polar channels indicated by the first mother code elements, where N1 is a positive integer multiple of N0, N0 equals to $2^x$, N1 equals to $2^y$, and X and Y both are positive integers; and the first indication elements at different locations in the first indication sequence have at least two different values, and correspondingly, B also has at least two different values, where B is an integer, and the at least two different values are consecutive values starting from 0.

The first encoding module is further configured to encode the data block in a polar encoding manner by using the first mother code sequence.

The interface module is further configured to output a result obtained after the data block is encoded.

The data processing apparatus shown in FIG. 12 provided in this embodiment of the present invention may be configured to perform embodiments of the data processing method shown in FIG. 3. Implementation principles and technical effects thereof are similar, and details are not described herein again. Specifically, specific implementations of S201 and S204 in the data processing method shown in FIG. 3 may also be correspondingly used as specific implementations of functions of the interface module of the data processing apparatus shown in FIG. 12. Specific implementations of S202 and S203 in the data processing method shown in FIG. 3 may also be correspondingly used as specific implementations of functions of the first encoding module of the data processing apparatus shown in FIG. 12.

Figure 13:
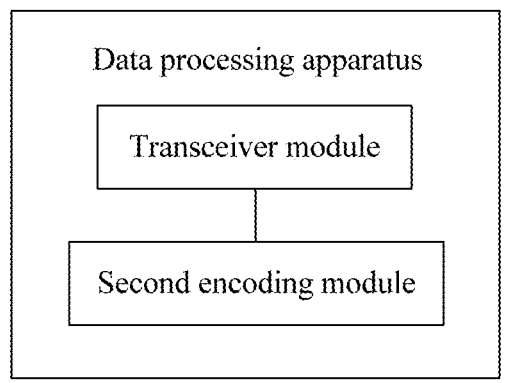
FIG. 13 is a schematic structural diagram of another data processing apparatus according to an embodiment of the present invention.

FIG. 13 is a schematic structural diagram of another data processing apparatus according to an embodiment of the present invention. The data processing apparatus shown in FIG. 13 includes: a transceiver module, configured to receive a to-be-encoded data block; and a second encoding module, configured to: obtain a first mother code element for each first indication element in a first indication sequence based on an association relationship in which $S=Q+B*N0$, where B is a value indicated by the first indication element, N0 is a quantity of first basic elements in the first indication sequence, Q is a value indicated by a first basic element corresponding to the first indication element, and S is a value indicated by the first mother code element; and place the first mother code element at a location of the first indication element in the first indication sequence to obtain a first mother code sequence, where the N0 first basic elements are used to indicate N0 consecutive polar channel sequence numbers; a total quantity of the first indication elements and the first basic elements in the first indication sequence is N1, and correspondingly, a total quantity of the first mother code elements and the first basic elements in the first mother code sequence is also N1; the N1 elements including the first mother code elements and the first basic elements are used to indicate N1 consecutive polar channel sequence numbers, the N1 polar channel sequence numbers include the N0 polar channel sequence numbers, and the polar channel sequence number is used to indicate a polar channel; the first mother code elements and the first basic elements are ranked in the first mother code sequence in ascending order or descending order of reliability of polar channels indicated by the first mother code elements and the first basic elements, where N1 is a positive integer multiple of N0, N0 equals to $2^x$, N1 equals to $2^y$, and X and Y both are positive integers; and the first indication elements at different locations in the first indication sequence have one value or a plurality of different values, and correspondingly, B also has one value or a plurality of different values, where B is an integer, the plurality of different values of B are consecutive values starting from 1, and B is 1 when B has one value. The second encoding module is further configured to encode the data block in a polar encoding manner by using the first mother code sequence. The transceiver module is further configured to output a result obtained after the data block is encoded.

The data processing apparatus shown in FIG. 13 provided in this embodiment of the present invention may be configured to perform embodiments of the data processing method shown in FIG. 4. Implementation principles and technical effects thereof are similar, and details are not described herein again. Specifically, specific implementations of S201 and S204 in the data processing method shown in FIG. 4 may also be correspondingly used as specific implementations of functions of the transceiver module of the data processing apparatus shown in FIG. 13. Specific implementations of S302 and S203 in the data processing method shown in FIG. 4 may also be correspondingly used as specific implementations of functions of the second encoding module of the data processing apparatus shown in FIG. 13.

Figure 14:
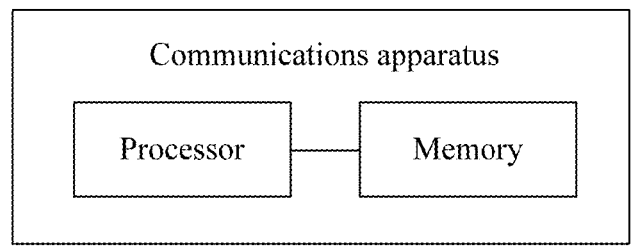
FIG. 14 is a schematic structural diagram of a communications apparatus according to an embodiment of the present invention.

FIG. 14 is a schematic structural diagram of a communications apparatus according to an embodiment of the present invention, and the communications apparatus includes a processor and a memory interconnected to the processor. When the communications apparatus runs, the processor reads and executes an instruction in the memory or runs a hardware logic circuit of the processor, so that the communications apparatus performs embodiments of any one of the data processing methods shown in FIG. 3 to FIG. 11.

In this embodiment of the communications apparatus, the memory is configured to store the instruction, and the memory may be independent of the processor, or may be integrated into the processor.

The communications apparatus may further include a transceiver (not shown in the figure) configured to receive and/or send data. The communications apparatuses in this embodiment of this application may be any device with a wireless communication function, for example, an access point, a station, user equipment, or a base station.

In addition, the communications apparatus may further have a dual function of encoding and decoding. When being used as an encoding end, the communications apparatus performs an encoding operation, and when being used as a decoding end, the communications apparatus performs a decoding operation. The communications apparatus includes a baseband chip. The baseband chip includes an encoder and a decoder. The encoder may be configured to implement a same function as the foregoing encoding end, and the decoder may implement a same function as the foregoing decoding end.

In the foregoing embodiments, the processor may be an integrated circuit operating according to a non-fixed instruction or an integrated circuit operating according to a fixed instruction. The processor operating according to a non-fixed instruction reads and executes the instruction in the memory to implement embodiments of any one of the data processing methods shown in FIG. 3 to FIG. 11, or implement embodiments of any one of the data processing apparatuses shown in FIG. 12 and FIG. 13. The processor operating according to a fixed instruction runs a hardware logic circuit of the processor to implement embodiments of any one of the data processing methods shown in FIG. 3 to FIG. 11, or implement embodiments of any one of the data processing apparatuses shown in FIG. 12 and FIG. 13. In a process of running the hardware logic circuit of the processor operating according to a fixed instruction, the processor usually also needs to read some data from the memory or output a running result to the memory. The memory is a storage medium that is easy to read by a processor, such as a random access memory (Random Access Memory, ROM for short), a flash memory, a read-only memory (Read Only Memory, RAM for short), a programmable read-only memory, an electrically erasable programmable memory, a cache (CACHE), or a register.

In the foregoing embodiments, The processor may be a central processing unit (Central Processing Unit, CPU for short), a graphics processing unit (Graphics Processing Unit, GPU for short), a digital signal processor (Digital Signal Processor, DSP for short), an application-specific integrated circuit (Application Specific Integrated Circuit, ASIC for short), a field programmable gate array (Field Programmable Gate Array, FPGA for short), and a network processor (Network Processor, NP for short), another programmable logic device, a discrete gate or a transistor logic device, a discrete hardware component, or the like.

All or some of the foregoing embodiments may be implemented by using software, hardware, firmware, or any combination thereof. When software is used to implement the embodiments, the embodiments may be implemented completely or partially in a form of a computer program product. The computer program product includes one or more computer instructions. When the computer program instructions are loaded and executed on the computer, the procedures or functions according to the embodiments of the present invention are all or partially generated. The computer may be a general-purpose computer, a dedicated computer, a computer network, or another programmable apparatus. The computer instructions may be stored in a computer-readable storage medium or transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, microwave, or the like) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid state disk (Solid State Disk, SSD)), or the like.

In addition, the term "and/or" in this specification describes only an association relationship for describing associated objects and represents that three relationships may exist. For example, A and/or B may represent the following three cases: Only A exists, both A and B exist, and only B exists. In addition, the character "/" in this specification usually indicates an "or" relationship between the associated objects.

"A plurality of" in this specification means two or more than two.

What is claimed is:

1. A data processing method, comprising:
receiving, by an encoding end, a to-be-encoded data block;
obtaining, by the encoding end, a first mother code element for each first indication element in a first indication sequence based on an association relationship in which S=Q+B*N0 when B>0, and S=Q when B=0, wherein B is a value indicated by the first indication element, N0 is a quantity of first basic elements in a first basic sequence, Q is a value indicated by a first basic element corresponding to the first indication element, and S is a value indicated by the first mother code element;
placing the first mother code element at a location of the first indication element in the first indication sequence to obtain a first mother code sequence, wherein the N0 first basic elements in the first basic sequence are used to indicate N0 consecutive polar channel sequence numbers, N1 first mother code elements in the first mother code sequence are used to indicate N1 consecutive polar channel sequence numbers, the N1 polar channel sequence numbers comprise the N0 polar channel sequence numbers, and a polar channel sequence number is used to indicate a polar channel; the first mother code elements are ranked in the first mother code sequence in ascending order or descending order of reliability of polar channels indicated by the first mother code elements, wherein N1 is a positive integer multiple of N0, N0 equals to $2^x$, N1 equals to $2^y$, and X and Y both are positive integers; and the first indication elements at different locations in the first indication sequence have at least two different values, and correspondingly, B also has at least two different values, wherein B is an integer, and the at least two different values are consecutive values starting from 0;
encoding, by the encoding end, the data block in a polar encoding manner by using the first mother code sequence; and
outputting, by the encoding end, a result obtained after the data block is encoded.

2. The data processing method according to claim 1, wherein that the N0 first basic elements are used to indicate N0 consecutive polar channel sequence numbers, and N1 first mother code elements are used to indicate N1 consecutive polar channel sequence numbers includes:
the N0 first basic elements are used to indicate polar channel sequence numbers from W to W+N0−1, and the N1 first mother code elements are used to indicate polar channel sequence numbers from W to W+N1−1, wherein W is an integer greater than or equal to 0.

3. The data processing method according to claim 1, wherein when the N1 first mother code elements are ranked in the first mother code sequence in ascending order of reliability of the polar channels indicated by the polar channel sequence numbers indicated by the N1 first mother code elements, correspondingly, N1 first indication elements in the first indication sequence are ranked in ascending order or descending order of reliability of polar channels indicated by polar channel sequence numbers indirectly indicated by the N1 first indication elements, and the N0 first basic elements are ranked in the first basic sequence in ascending order or descending order of reliability of polar channels indicated by the polar channel sequence numbers indicated by the N0 first basic elements.

4. The data processing method according to claim 1, wherein when the N1 first mother code elements are ranked in the first mother code sequence in descending order of reliability of the polar channels indicated by the polar channel sequence numbers indicated by the N1 first mother code elements, correspondingly, N1 first indication elements in the first indication sequence are ranked in descending order or ascending order of reliability of polar channels indicated by polar channel sequence numbers indirectly indicated by the N1 first indication elements, and the N0 first basic elements are ranked in the first basic sequence in ascending order or descending order of reliability of polar channels indicated by the polar channel sequence numbers indicated by the N0 first basic elements.

5. The data processing method according to claim 1, before the obtaining, by the encoding end, a first mother code sequence, the method further comprising:
extracting, by the encoding end from a second indication sequence, each second indication element indicating a value less than a maximum value of B and each second indication element indicating a value equal to the maximum value of B; and ranking the second indication elements in an order in which the second indication elements are ranked in the second indication sequence, to form the first indication sequence, wherein the second indication element indicating the value less than the maximum value of B and the second indication element indicating the value equal to the maximum value of B both are used as the first indication elements in the first indication sequence, and in addition to the second indication element indicating the value less than the maximum value of B and the second indication element indicating the value equal to the maximum value of B, the second indication sequence comprises a second indication element indicating a value greater than the maximum value of B.

6. The data processing method according to claim 1, before the obtaining, by the encoding end, a first mother code sequence, the method further comprising:
extracting, by the encoding end from a second basic sequence, each second basic element indicating a value less than F and each second basic element indicating a value equal to F; and ranking the second basic elements in an order in which the second basic elements are ranked in the second basic sequence, to form the first basic sequence, wherein the second basic element indicating the value less than F and the second basic element indicating the value equal to F both are used as the first basic elements in the first basic sequence, and in addition to the second basic element indicating the value less than F and the second basic element indicating the value equal to F, the second basic sequence comprises a second basic element indicating a value greater than F, wherein F is a positive integer.

7. The data processing method according to claim 1, before the obtaining, by the encoding end, a first mother code sequence, the method further comprising:

obtaining, by the encoding end, the first basic element for each third indication element in a third indication sequence based on an association relationship in which S1=Q1+B1*N3 when B1>0, and S1=Q1 when B1=0, wherein B1 is a value indicated by the third indication element, N3 is a quantity of third basic elements in a third basic sequence, Q1 is a value indicated by a third basic element corresponding to the third indication element, S1 is a value indicated by the first basic element; and placing the first basic element at a location of the third indication element in the third indication sequence to obtain the first basic sequence, wherein the N3 third basic elements are used to indicate consecutive N3 polar channel sequence numbers, the N0 first basic elements are used to indicate N0 consecutive polar channel sequence numbers, the N0 polar channel sequence numbers comprise the N3 polar channel sequence numbers, and the polar channel sequence number is used to indicate a polar channel; the first basic elements are ranked in the first basic sequence in ascending order or descending order of reliability of polar channels indicated by the first basic elements; a quantity of third indication elements in the third indication sequence is N0, and correspondingly, the quantity of first basic elements in the first basic sequence is also N0, wherein N0 is a positive integer multiple of N3, N3 is $2^P$, and P is a positive integer; and the third indication elements at different locations in the third indication sequence have at least two different values, and correspondingly, B1 also has at least two different values, wherein B1 is an integer, and the at least two different values are consecutive values starting from 0.

8. The data processing method according to claim 1, before the obtaining, by the encoding end, a first mother code sequence, the method further comprising:

obtaining, by the encoding end, the first basic element for each third indication element in a third indication sequence based on an association relationship in which S1=Q1+B1*N3, wherein B1 is a value indicated by the third indication element, N3 is a quantity of third basic elements in the third indication sequence, Q1 is a value indicated by a third basic element corresponding to the third indication element, S1 is a value indicated by the first basic element; and placing the first basic element at a location of the third indication element in the third indication sequence to obtain the first basic sequence, wherein a total quantity of the third basic elements and the third indication elements in the third indication sequence is N0, the third basic element in the third indication sequence is correspondingly used as the first basic element, and correspondingly, the quantity of first basic elements in the first basic sequence is also N0; the N3 third basic elements are used to indicate consecutive N3 polar channel sequence numbers, N0 first basic elements in the first basic sequence are used to indicate N0 consecutive polar channel sequence numbers, the N0 polar channel sequence numbers comprise the N3 polar channel sequence numbers, and the polar channel sequence number is used to indicate a polar channel; the first basic elements are ranked in the first basic sequence in ascending order or descending order of reliability of polar channels indicated by the first basic elements, wherein N0 is a positive integer multiple of N3, N3 is $2^P$, and P is a positive integer; and the third indication elements at different locations in the third indication sequence have one value or a plurality of different values, and correspondingly, B1 also has one value or a plurality of different values, wherein B1 is an integer, the plurality of different values of B1 are consecutive values starting from 1, and B1 is 1 when B1 has one value.

9. A data processing method, comprising:

receiving, by an encoding end, a to-be-encoded data block;

obtaining, by the encoding end, a first mother code element for each first indication element in a first indication sequence based on an association relationship in which S=Q+B*N0, wherein B is a value indicated by the first indication element, N0 is a quantity of first basic elements in the first indication sequence, Q is a value indicated by a first basic element corresponding to the first indication element, and S is a value indicated by the first mother code element;

placing the first mother code element at a location of the first indication element in the first indication sequence to obtain a first mother code sequence, wherein the N0 first basic elements are used to indicate N0 consecutive polar channel sequence numbers; a total quantity of the first indication elements and the first basic elements in the first indication sequence is N1, and correspondingly, a total quantity of the first mother code elements and the first basic elements in the first mother code sequence is also N1; the N1 elements comprising the first mother code elements and the first basic elements are used to indicate N1 consecutive polar channel sequence numbers, the N1 polar channel sequence numbers comprise the N0 polar channel sequence numbers, and a polar channel sequence number is used to indicate a polar channel; the first mother code elements and the first basic elements are ranked in the first mother code sequence in ascending order or descending order of reliability of polar channels indicated by the first mother code elements and the first basic elements, wherein N1 is a positive integer multiple of N0, N0 equals to $2^x$, N1 equals to $2^y$, and X and Y both are positive integers; and the first indication elements at different locations in the first indication sequence have one value or a plurality of different values, and correspondingly, B also has one value or a plurality of different values, wherein B is an integer, the plurality of different values of B are consecutive values starting from 1, and B is 1 when B has one value;

encoding, by the encoding end, the data block in a polar encoding manner by using the first mother code sequence; and outputting, by the encoding end, a result obtained after the data block is encoded.

10. The data processing method according to claim 9, wherein that the N0 first basic elements are used to indicate N0 consecutive polar channel sequence numbers, and N1 first mother code elements are used to indicate N1 consecutive polar channel sequence numbers includes:

the N0 first basic elements are used to indicate polar channel sequence numbers from W to W+N0−1, and the N1 first mother code elements are used to indicate polar channel sequence numbers from W to W+N1−1, wherein W is an integer greater than or equal to 0.

11. The data processing method according to claim 9, wherein when the N1 first mother code elements are ranked in the first mother code sequence in ascending order of reliability of the polar channels indicated by the polar channel sequence numbers indicated by the N1 first mother code elements, correspondingly, the N1 elements comprising the first indication elements and the first basic elements are ranked in the first indication sequence in ascending order or descending order of reliability of polar channels indicated by polar channel sequence numbers directly or indirectly indicated by the N1 elements comprising the first indication elements and the first basic elements.

12. The data processing method according to claim 9, wherein when the N1 first mother code elements are ranked in the first mother code sequence in descending order of reliability of the polar channels indicated by the polar channel sequence numbers indicated by the N1 first mother code elements, correspondingly, the N1 elements comprising the first indication elements and the first basic elements are ranked in the first indication sequence in ascending order or descending order of reliability of polar channels indicated by polar channel sequence numbers directly or indirectly indicated by the N1 elements comprising the first indication elements and the first basic elements.

13. The data processing method according to claim 9, before the obtaining, by the encoding end, a first mother code sequence, the method further comprising:
    extracting, by the encoding end from a second indication sequence, each second indication element indicating a value less than a maximum value of B and each second indication element indicating a value equal to the maximum value of B; and ranking the second indication elements in an order in which the second indication elements are ranked in the second indication sequence, to form the first indication sequence, wherein the second indication element indicating the value less than the maximum value of B and the second indication element indicating the value equal to the maximum value of B both are used as the first indication elements in the first indication sequence, and in addition to the second indication element indicating the value less than the maximum value of B and the second indication element indicating the value equal to the maximum value of B, the second indication sequence comprises a second indication element indicating a value greater than the maximum value of B.

14. The data processing method according to claim 9, before the obtaining, by the encoding end, a first mother code sequence, the method further comprising:
    extracting, by the encoding end from a second basic sequence, each second basic element indicating a value less than F and each second basic element indicating a value equal to F; and ranking the second basic elements in an order in which the second basic elements are ranked in the second basic sequence, to form the first basic sequence, wherein the second basic element indicating the value less than F and the second basic element indicating the value equal to F both are used as the first basic elements in the first basic sequence, and in addition to the second basic element indicating the value less than F and the second basic element indicating the value equal to F, the second basic sequence comprises a second basic element indicating a value greater than F, wherein F is a positive integer.

15. The data processing method according to claim 9, before the obtaining, by the encoding end, a first mother code sequence, the method further comprising:
    obtaining, by the encoding end, the first basic element for each third indication element in a third indication sequence based on an association relationship in which $S1=Q1+B1*N3$ when $B1>0$, and $S1=Q1$ when $B1=0$, wherein B1 is a value indicated by the third indication element, N3 is a quantity of third basic elements in a third basic sequence, Q1 is a value indicated by a third basic element corresponding to the third indication element, S1 is a value indicated by the first basic element; and placing the first basic element at a location of the third indication element in the third indication sequence to obtain the first basic sequence, wherein the N3 third basic elements are used to indicate consecutive N3 polar channel sequence numbers, the N0 first basic elements are used to indicate N0 consecutive polar channel sequence numbers, the N0 polar channel sequence numbers comprise the N3 polar channel sequence numbers, and the polar channel sequence number is used to indicate a polar channel; the first basic elements are ranked in the first basic sequence in ascending order or descending order of reliability of polar channels indicated by the first basic elements; a quantity of third indication elements in the third indication sequence is N0, and correspondingly, the quantity of first basic elements in the first basic sequence is also N0, wherein N0 is a positive integer multiple of N3, N3 is $2^P$, and P is a positive integer; and the third indication elements at different locations in the third indication sequence have at least two different values, and correspondingly, B1 also has at least two different values, wherein B1 is an integer, and the at least two different values are consecutive values starting from 0.

16. The data processing method according to claim 9, before the obtaining, by the encoding end, a first mother code sequence, the method further comprising:
    obtaining, by the encoding end, the first basic element for each third indication element in a third indication sequence based on an association relationship in which $S1=Q1+B1*N3$, wherein B1 is a value indicated by the third indication element, N3 is a quantity of third basic elements in the third indication sequence, Q1 is a value indicated by a third basic element corresponding to the third indication element, S1 is a value indicated by the first basic element; and placing the first basic element at a location of the third indication element in the third indication sequence to obtain the first basic sequence, wherein a total quantity of the third basic elements and the third indication elements in the third indication sequence is N0, the third basic element in the third indication sequence is correspondingly used as the first basic element, and correspondingly, the quantity of first basic elements in the first basic sequence is also N0; the N3 third basic elements are used to indicate consecutive N3 polar channel sequence numbers, the N0 first basic elements in the first basic sequence are used to indicate N0 consecutive polar channel sequence numbers, the N0 polar channel sequence numbers comprise the N3 polar channel sequence numbers, and the polar channel sequence number is used to indicate a polar channel; the first basic elements are ranked in the first basic sequence in ascending order or descending order of reliability of polar channels indicated by the first basic elements, wherein N0 is a positive integer multiple of N3, N3 is $2^P$, and P is a positive integer; and the third indication elements at different locations in the third indication sequence have one value or a plurality of different values, and correspondingly, B1 also has one value or a plurality of different values, wherein B1 is an integer, the plurality of different values of B1 are consecutive values starting from 1, and B1 is 1 when B1 has one value.

17. A data processing apparatus, comprising:
an interface module, configured to receive a to-be-encoded data block; and
a first encoding module, configured to obtain a first mother code element for each first indication element in a first indication sequence based on an association relationship in which $S=Q+B*N0$ when $B>0$, and $S=Q$ when $B=0$, wherein B is a value indicated by the first indication element, N0 is a quantity of first basic elements in a first basic sequence, Q is a value indicated by a first basic element corresponding to the first indication element, and S is a value indicated by the first mother code element; and place the first mother code element at a location of the first indication element in the first indication sequence to obtain a first mother code sequence, wherein the N0 first basic elements in the first basic sequence are used to indicate N0 consecutive polar channel sequence numbers, N1 first mother code elements in the first mother code sequence are used to indicate N1 consecutive polar channel sequence numbers, the N1 polar channel sequence numbers comprise the N0 polar channel sequence numbers, and a polar channel sequence number is used to indicate a polar channel; the first mother code elements are ranked in the first mother code sequence in ascending order or descending order of reliability of polar channels indicated by the first mother code elements, wherein N1 is a positive integer multiple of N0, N0 equals to $2^x$, N1 equals to $2^y$, and X and Y both are positive integers; and the first indication elements at different locations in the first indication sequence have at least two different values, and correspondingly, B also has at least two different values, wherein B is an integer, and the at least two different values are consecutive values starting from 0, wherein
the first encoding module is further configured to encode the data block in a polar encoding manner by using the first mother code sequence; and
the interface module is further configured to output a result obtained after the data block is encoded.

18. The data processing apparatus according to claim 17, wherein that the N0 first basic elements are used to indicate N0 consecutive polar channel sequence numbers, and N1 first mother code elements are used to indicate N1 consecutive polar channel sequence numbers includes:
the N0 first basic elements are used to indicate polar channel sequence numbers from W to W+N0−1, and the N1 first mother code elements are used to indicate polar channel sequence numbers from W to W+N1−1, wherein W is an integer greater than or equal to 0.

19. The data processing apparatus according to claim 17, wherein when the N1 first mother code elements are ranked in the first mother code sequence in ascending order of reliability of the polar channels indicated by the polar channel sequence numbers indicated by the N1 first mother code elements, correspondingly, N1 first indication elements in the first indication sequence are ranked in ascending order or descending order of reliability of polar channels indicated by polar channel sequence numbers indirectly indicated by the N1 first indication elements, and the N0 first basic elements are ranked in the first basic sequence in ascending order or descending order of reliability of polar channels indicated by the polar channel sequence numbers indicated by the N0 first basic elements.

20. The data processing apparatus according to claim 17, wherein when the N1 first mother code elements are ranked in the first mother code sequence in descending order of reliability of the polar channels indicated by the polar channel sequence numbers indicated by the N1 first mother code elements, correspondingly, N1 first indication elements in the first indication sequence are ranked in descending order or ascending order of reliability of polar channels indicated by polar channel sequence numbers indirectly indicated by the N1 first indication elements, and the N0 first basic elements are ranked in the first basic sequence in ascending order or descending order of reliability of polar channels indicated by the polar channel sequence numbers indicated by the N0 first basic elements.

* * * * *